(12) United States Patent
Staudinger et al.

(10) Patent No.: US 12,212,290 B2
(45) Date of Patent: Jan. 28, 2025

(54) DYNAMIC POWER AMPLIFIER WITH EXTERNAL FORCING SIGNAL

(71) Applicant: NXP USA, Inc., Austin, TX (US)

(72) Inventors: Joseph Staudinger, Gilbert, AZ (US); Edward Provo Wallis Horne, Ontario (CA); Matthew Russell Greene, Crystal Lake, IL (US); Johannes Lambertus Holt, Calgary (CA)

(73) Assignee: NXP USA, Inc., Austin, TX (US)

( * ) Notice: Subject to any disclaimer, the term of this patent is extended or adjusted under 35 U.S.C. 154(b) by 526 days.

(21) Appl. No.: 17/504,046

(22) Filed: Oct. 18, 2021

(65) Prior Publication Data

US 2023/0120079 A1 Apr. 20, 2023

(51) Int. Cl.
| | |
|---|---|
| *H03F 3/195* | (2006.01) |
| *H03F 1/02* | (2006.01) |
| *H03F 1/56* | (2006.01) |
| *H03F 3/24* | (2006.01) |

(52) U.S. Cl.
CPC .......... *H03F 3/195* (2013.01); *H03F 1/0288* (2013.01); *H03F 1/565* (2013.01); *H03F 3/245* (2013.01); *H03F 2200/102* (2013.01); *H03F 2200/451* (2013.01)

(58) Field of Classification Search
CPC ........ H03F 1/0288; H03F 3/195; H03F 1/565; H03F 3/245; H03F 2200/102; H03F 2200/451
USPC ..................................... 330/285, 124 R, 295
See application file for complete search history.

(56) References Cited

U.S. PATENT DOCUMENTS

| | | | |
|---|---|---|---|
| 7,248,108 B2 | 7/2007 | Fratti | |
| 8,576,010 B2 | 11/2013 | Yanduru et al. | |
| 10,447,209 B2* | 10/2019 | Wang | ...................... H03F 3/211 |
| 2011/0148518 A1 | 6/2011 | Lejon et al. | |

(Continued)

FOREIGN PATENT DOCUMENTS

WO 2017020255 A1 2/2017

OTHER PUBLICATIONS

U.S. Appl. No. 16/951,781; 38 pages (filed Nov. 18, 2020).
(Continued)

*Primary Examiner* — Andrea Lindgren Baltzell
*Assistant Examiner* — Khiem D Nguyen

(57) ABSTRACT

A device includes an amplifier having an input terminal and an output terminal. The input terminal is configured to receive a radio frequency (RF) input signal. The device includes an output network coupled to the output terminal of the power amplifier and a first passively tunable integrated circuit (PTIC) coupled to the output network. The first PTIC includes a direct-current (DC) bias voltage input terminal configured to receive a fixed bias voltage, a control signal input terminal configured to receive a time-varying control signal, wherein the fixed bias voltage in combination with the time-varying control signal sets an operating reference point of the first PTIC, and an input terminal electrically connected to the output terminal of the amplifier, wherein a change in an output voltage signal generated by the power amplifier causes the first PTIC to modify a first effective impedance of a load presented to the power amplifier via the output network.

20 Claims, 14 Drawing Sheets

(56) References Cited

U.S. PATENT DOCUMENTS

2012/0092074 A1\* 4/2012 Yanduru ............... H03F 1/0288
                                                                  330/295
2018/0241352 A1     8/2018 Wang

OTHER PUBLICATIONS

Maune, Holger et al; "Tunable Impedance Matching Networks for Agile RF Power Amplifiers"; IEEE MTT-S Int'l Microwave Symposium; page (2011).

\* cited by examiner

DYNAMIC POWER AMPLIFIER WITH EXTERNAL FORCING SIGNAL

TECHNICAL FIELD

Embodiments of the subject matter described herein relate generally to radio frequency (RF) power amplifiers, and more particularly to Doherty power amplifiers.

BACKGROUND

A typical Doherty power amplifier includes a signal splitter to receive and divide an input RF signal, a carrier amplifier (also referred to as a "main" amplifier) to amplify a first signal from the splitter, a peaking amplifier (also referred to as an "auxiliary" amplifier) to amplify a second signal from the splitter, a signal combiner to combine the amplified signals from the carrier and peaking amplifiers, and various impedance transformation and phase delay elements to ensure that the amplified signals are combined in phase at a load, and that desirable impedances are present at various points within the Doherty power amplifier.

Amplifier performance can be affected by modulation of the load presented to the carrier and peaking amplifiers. Accordingly, a fixed load may enable efficient performance of the amplifier at particular power levels, while resulting in inefficient performance at other (e.g., lower) power levels.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
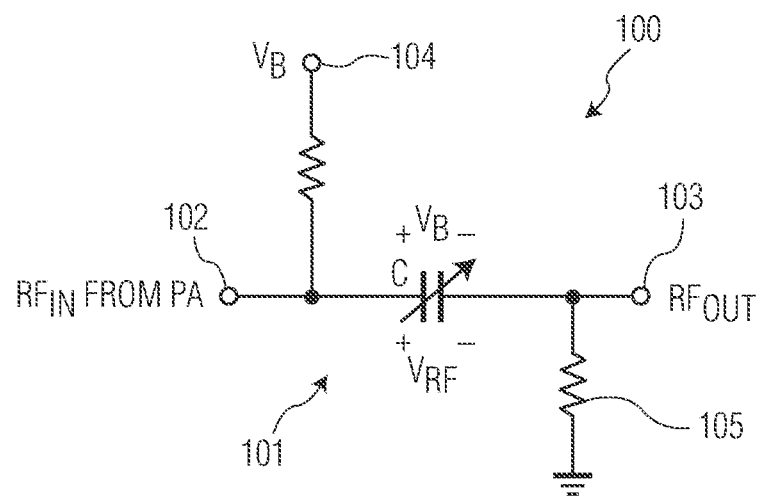
FIG. 1 is a schematic circuit diagram that illustrates a configuration of a non-linear variable reactance or impedance component implemented within an RF signal chain.

A system and method to implement load modulation in RF power amplifiers is disclosed. This method can be applied broadly to many types of power amplifiers to load modulate the power amplifier or to further extend any existing load modulation, thereby realizing improved efficiency. This approach can be applied to amplifiers operated in class A/B/C/F (and other) modes, which are not typically load modulated, and transform them into more efficient amplifiers through load modulation using this method. In particular, the system realizes load modulation in such amplifiers, and may be implemented in Doherty RF power amplifiers as well to extend the range of load modulation and improve the efficiency of Doherty amplifiers. In an embodiment, the system and method utilize a reactance having a non-linear operating characteristic, placed in an output matching network of a Doherty carrier amplifier to enable load modulation of the carrier amplifier. Other embodiments are contemplated by the subject disclosure.

Aspects of the present disclosure include an amplifier that has an input terminal and an output terminal. An input network can be coupled to the input terminal of the amplifier and an output network coupled to the output terminal of the amplifier. A non-linear reactance or impedance component can be further coupled to the output network. The impedance of the non-linear impedance component is modulated by an external control signal. In various embodiments, the external control signal is derived from or affected by the RF input signal to the power amplifier. As the input RF signal changes, the non-linear impedance component changes an effective impedance of a load presented to the power amplifier via the output network.

The non-linear impedance component can be configured to utilize a fixed bias voltage that serves as an operating reference point of the non-linear impedance component. The non-linear impedance component can include a plurality of impedance or reactance elements (e.g., variable capacitors) arranged in series. A number of the plurality of impedance elements can be selected to produce a non-linear impedance profile that operates within a range of the output voltage signal generated by the amplifier and the operating reference point of the non-linear impedance component.

Aspects of the present disclosure further include a Doherty amplifier that includes a carrier amplifier coupled to a first output network, the first output network includes a non-linear impedance component configured to receive an external control signal to determine or control the impedance of the non-linear impedance component. The external control signal can be derived from or based upon aspects of the RF input signal to the Doherty amplifier, either taken at the input to the Doherty amplifier or at any point along one or more of the amplification paths of the Doherty amplifier. A peaking amplifier can be coupled to a second output network that is also coupled to the first output network resulting in a combined network configurable for coupling to a load. A change in the external control signal to the non-linear impedance component causes the non-linear impedance component to change an effective impedance of the load presented to the carrier amplifier via the combined network.

Generally speaking, the principle of dynamic load modulation is defined as a change in the effective impedance of a load presented to a power amplifier, which can be based on the operating power of the power amplifier. For example, if the RF input voltage to an RF power amplifier is decreased, and hence the RF output voltage from the RF power amplifier decreases, the RF output network changes the effective impedance of the load due to a non-linear characteristic of one or more components in the RF output network. If the effective load impedance presented to the power amplifier is increased as the RF voltage decreases, a higher efficiency can be achieved by the amplifier at lower output power levels.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

As used herein, the term "transistor" may mean a field effect transistor (FET), a bipolar junction transistor (BJT), or another type of transistor. For example, a "FET" may be a metal-oxide-semiconductor FET (MOSFET), a laterally diffused MOSFET (LDMOS FET), an enhancement-mode or depletion-mode high electron mobility transistor (HEMT), or another type of FET. A "BJT" transistor may be a heterojunction bipolar transistor (HBT). The description below refers to a transistor as including a control terminal and two current-conducting terminals. For example, using terminology associated with FETs, a "control terminal" refers to a gate terminal of a transistor, and first and second current-conducting terminals refer to drain and source terminals (or vice versa) of a transistor. For example, using terminology associated with BJTs, a "control terminal" refers to a base terminal of a transistor, and first and second current-conducting terminals refer to collector and emitter terminals (or vice versa) of a transistor.

The terms "integrated circuit die" and "IC die" mean a single, distinct die within which one or more circuit components (e.g., transistors, passive devices, and so on) are integrated and/or directly physically connected. The term "SiGe . . . IC die" (e.g., as in a "SiGe driver stage IC die") means an integrated circuit die that includes one or more SiGe transistors. For example, a "SiGe . . . IC die" is a die that includes one or more SiGe HBTs formed in and/or on a SiGe substrate, a SiGe-on-insulator substrate, or another suitable SiGe-based substrate. A "SiGe power transistor" or "SiGe transistor" means a transistor in which the primary current-conducting channel is formed primarily from SiGe semiconductor materials. The term "GaN . . . IC die" (e.g., as in a "GaN final stage IC die") mean an integrated circuit die that includes a GaN power transistor. For example, a "GaN . . . IC die" is a die that includes a GaN power transistor formed in and/or on a GaN substrate, a GaN-on-silicon substrate, a GaN-on-silicon carbide (SiC) substrate, a GaN on aluminum nitride (AlN) substrate, a GaN on sapphire substrate, a GaN on diamond substrate, or another suitable GaN-based hetero-epitaxy and substrate arrangement. A "GaN power transistor" or "GaN transistor" means a transistor in which the primary current-conducting channel is formed primarily from GaN semiconductor materials.

FIG. 1 is a schematic circuit diagram that illustrates a configuration of a non-linear variable reactance or impedance component implemented within an RF signal chain. Network 100 includes passively tunable integrated circuit (PTIC) 101, illustrated as a variable capacitor C, with a first terminal coupled through an RF input node ($RF_{IN}$) 102 to a PA, and a second terminal 103 coupled through an RF output ($RF_{OUT}$) to a load. Shunt resistor 105 (though in other embodiments, an inductor may be used in place of shunt resistor 105) is coupled between RF output 103 and a ground node. PTIC 101 includes, but is not limited to, other types of variable reactance components, including, varactor diodes, metal-oxide semiconductor (MOS) capacitors, or variable plate micro-electro-mechanical system (MEMS) capacitors. Other devices may be used, so long as the component exhibits a passive non-linear reactance that is continuously variable. PTIC 101 includes a bias input terminal 104 configured to receive an input DC bias voltage. The bias voltage supplied at input terminal 104 can control the non-linear reactance characteristics of reactance component 101.

Figure 2:
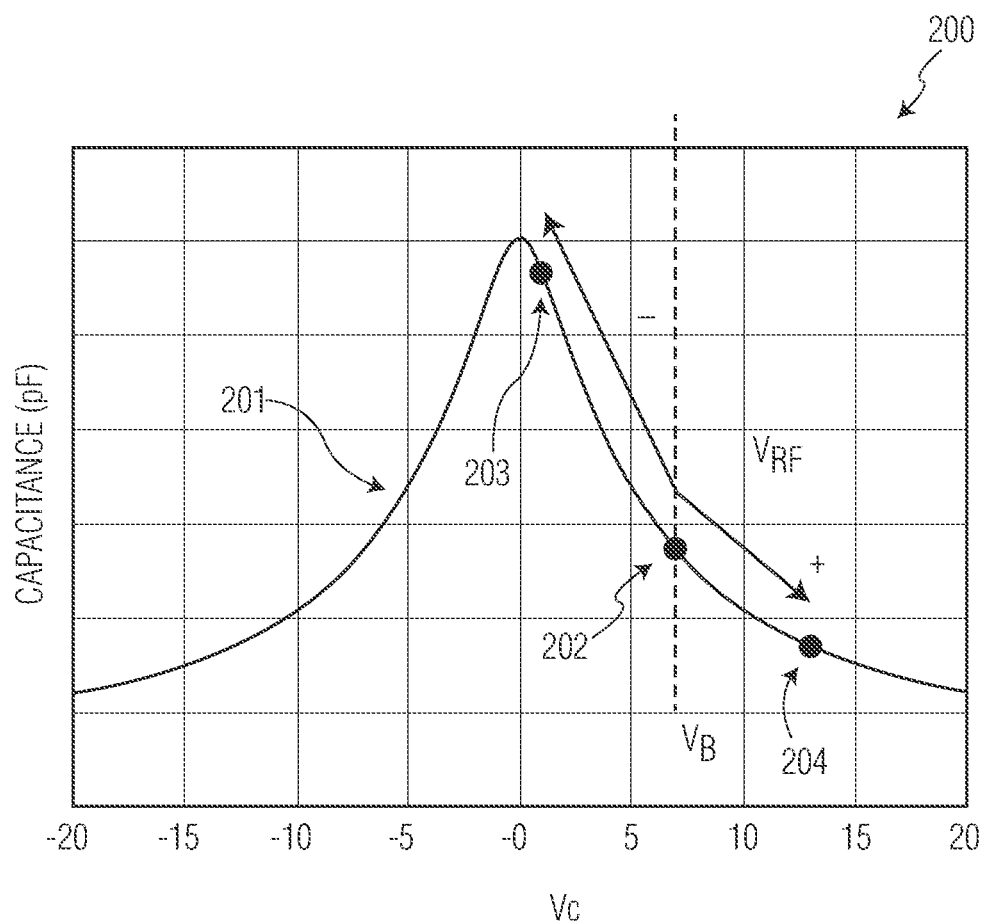
FIG. 2 is a graph depicting a non-linear capacitance characteristic of the passively tunable integrated circuit (PTIC) illustrated in FIG. 1 in relation to an RF signal and bias condition.

To illustrate, FIG. 2 is a graph depicting a non-linear capacitance characteristic of PTIC 101 illustrated in FIG. 1 in relation to the RF signal and bias condition. As shown in FIG. 2, the capacitance of PTIC 101 is inherently nonlinear as seen in the capacitance-voltage (C-V) curve 201 shown. The operating point of PTIC 101 depends upon a DC bias voltage $V_B$ applied across the component (e.g., at terminal 104). As shown in the graph 200, for a particular bias voltage ($V_B$), the capacitance of PTIC 101 has a particular value as indicated by the dotted line running through the dot 202 on C-V curve 201. The net voltage Vc seen by PTIC 101 is the sum of the DC bias voltage $V_B$ and the instantaneous RF voltage $V_{RF}$ (as shown in FIG. 1). The capacitance value of PTIC 101 varies non-linearly with respect to the voltage $V_C$. As $V_C$ decreases to point 203 (e.g., as a result of a decrease the RF voltage $V_{RF}$), the capacitance of non-linear reactance component 101 increases, and hence, the reactance decreases, thereby decreasing the effective impedance of the load. Conversely, as $V_C$ increases to point 204, the capacitance of non-linear reactance component 101 decreases, and hence, the reactance increases, thereby increasing the effective impedance of the load.

In some uses of PTICs, the DC bias voltage $V_B$ supplied at terminal 104 is fixed in the form of a DC bias voltage. In the present amplifier system and method, however, more fine-tuned control over the inductance characteristics of PTIC 101 is enabled by utilizing a non-fixed bias voltage during operation of PTIC 101. Specifically, non-fixed bias signal waveforms in the form of control signals are generated that may be a combination of a fixed DC bias voltage and externally generated time-varying signals. In embodiments, the time-varying signals may be at least partially derived from or generated as a function of a power or voltage level of the amplifier's input RF signal $RF_{IN}$. For example, time varying waveforms may be generated based upon an envelope waveform of the RF input signal $RF_{IN}$ or, equivalently, with respect to the amplitude modulation of the RF input signal $RF_{IN}$. An envelope signal is a signal that defines the voltage magnitude boundary of the RF input signal $RF_{IN}$. An envelope function is a function configured to take as input the RF input signal $RF_{IN}$ and generate as output the envelope signal of the RF input signal $RF_{IN}$. The time varying waveforms may then be provided as a control signal input to PTIC 101. In this manner, an "external" control signal (i.e., the combination of any DC bias signal, if present, and a time-varying signal) enables enhanced control of the PTIC operation as compared to approaches that utilize fixed bias signals.

In the present disclosure, the time-varying control signal may comprise a shaped waveform that is based upon the RF input signal $RF_{IN}$. As described herein, the control signal may be a shaped version of the envelope signal of the RF input. The signal may be shaped by the application of constraints to limit minimum and/or maximum values of the shaped control signal. Alternatively, or additionally, a hysteresis effect may be applied to the control signal so that the control signal may have different values depending upon whether the magnitude of the envelope of the RF input signal $RF_{IN}$ is increasing or decreasing.

Figure 3:
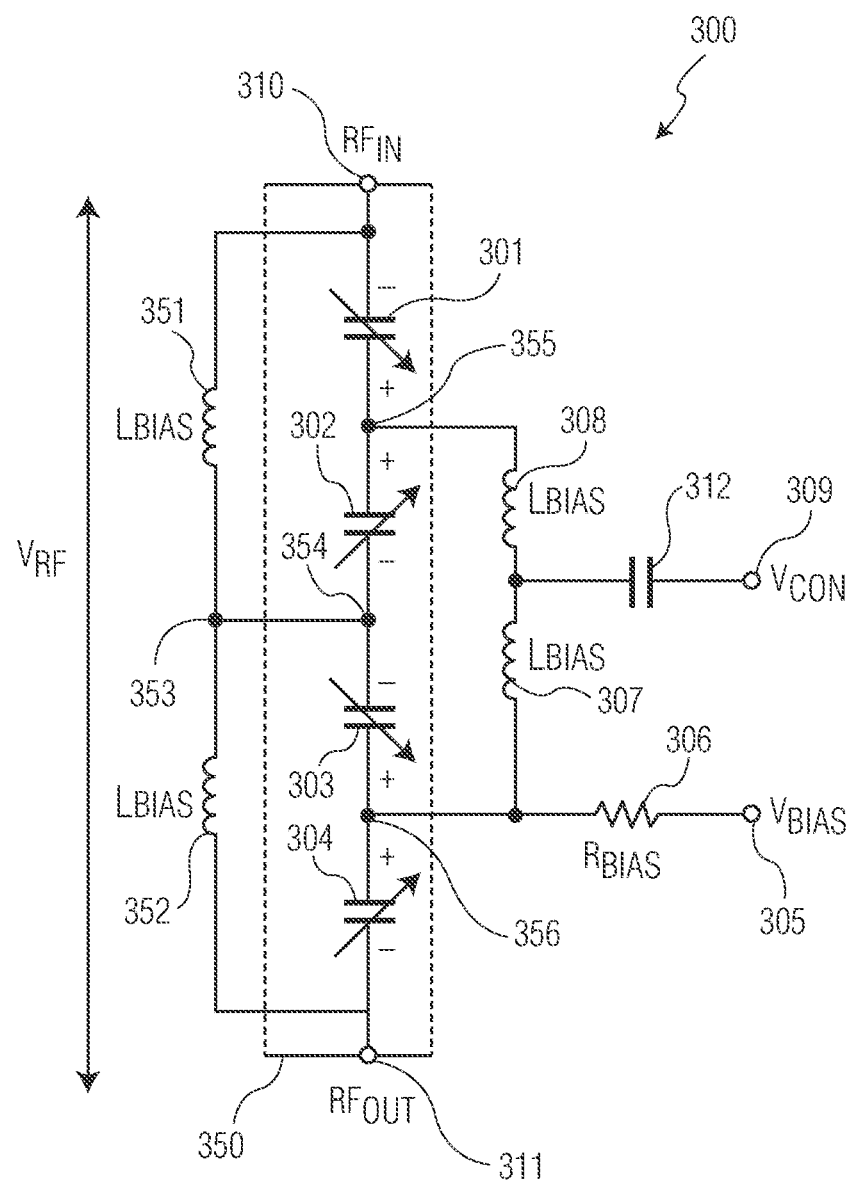
FIG. 3 is a schematic circuit diagram illustrating an embodiment of a PTIC configured to receive as input a DC bias voltage and a time-varying external control signal.

FIG. 3 is a schematic circuit diagram illustrating an embodiment of a PTIC configured to receive as control inputs a DC bias voltage and a time-varying external control signal. PTIC 300 includes a plurality of non-linear reactance elements, also referred to as a "stack." Specifically, PTIC 300 includes a number of series-connected non-linear reactance elements 301, 302, 303, 304 that may be configured to modulate the load impedance of a power amplifier as a function of the control signal VCON and DC bias signal $V_B$. Specifically, PTIC 300 includes a DC bias terminal 305 through which a DC bias voltage ($V_B$) can be applied to the stack of non-linear reactance elements 301, 302, 303, 304 through bias resistor 306 and across inductors 307 and 308. In various implementations, the DC bias voltage may be set to the voltage bias of an input signal to PTIC 300.

PTIC 300 includes a control signal terminal 309. A control signal ($V_{CON}$) applied to control signal terminal 309 is applied to the stack of non-linear reactance element 301, 302, 303, 304 through DC blocking capacitor 312 and across inductors 307 and 308. The polarity of the $V_B$ DC voltage and the VCON signal applied to each non-linear reactance element is illustrated in the circuit diagram with the '+' symbols representing a positive polarity and the '−' signals representing a negative polarity. Specifically, nodes 355 and 356 within the stack of non-linear reactance elements 301, 302, 303, 304 are set to a voltage value equal to $V_{CON}$ plus $V_B$. As depicted, the polarity of each reactance element 301, 302, 303, 304 is the opposite of the polarity of its nearest neighbor reactance element, which can provide anti-series bias to the stack of reactance elements 301, 302, 303, 304. This configuration can be beneficial as it may minimize or reduce acoustic vibrations that may be generated within the stack of PTIC 300. As an electric field is applied to reactance elements 301, 302, 303, 304 of PTIC 300, the electric field can be converted into a physical change of the lattice constants of the films making up reactance elements 301, 302, 303, 304. Simultaneous application of an AC signal to the material then causes acoustic vibrations of atoms in the crystalline lattice. At certain frequencies, determined by the layer thicknesses and materials in the capacitor stack, the acoustic response of the structure can be resonant and the losses of reactance elements 301, 302, 303, 304 will increase as energy is lost from the AC electrical signal due to those acoustic vibrations. The polarity configuration of reactance elements 301, 302, 303, 304 depicted in FIG. 3 may offset or reduce this effect, thereby increasing the efficiency of PTIC 300.

As an additional input to PTIC 300, an RF voltage ($V_{RF}$) is impressed across the stack 300 from RF input terminal 310 and RF output terminal 311. Inductors 351, 352 are coupled in series between RF input terminal 310 and RF output terminal 311 and the node 353 between inductors 351, 352 is connected to node 354 so that node 354 has a voltage equal to $V_{RF}/2$. In this configuration, therefore, each non-linear reactance element 301, 302, 303, 304 has across it a voltage equal $V_{RF}/4+(V_{dd}-V_{bias})+V_{CON}$, where $V_{dd}$ is the DC voltage present at nodes 310 and 311 (which may be assumed to be same). In some embodiments, $V_{dd}$ may be zero volts, or could be a non-zero value such as +48V.

Because the plurality of non-linear reactance elements 301, 302, 303, 304 are arranged in series, they act as a voltage divider, effectively providing a quarter of the RF voltage across each non-linear reactance element. When amplifying an RF signal, therefore, the load impedance of PTIC 300 changes as a function of the combination of the RF power applied across terminals 310 and 311 and the control signal applied at terminal 309 (in combination with the bias voltage applied at terminal 905). A power amplifier output network can therefore be designed utilizing the non-linear reactance elements 301, 302, 303, 304 such that when the power generated by the power amplifier increases, the increase in RF voltage across each non-linear reactance element will reduce an aggregate capacitance in the non-linear reactance elements 301, 302, 303 and 304, which is beneficial for high power operation of the PA. Conversely, when the power generated by the power amplifier output network is reduced, the reduction in RF voltage across the non-linear reactance element will increase the aggregate capacitance in non-linear reactance elements 301, 302, 303 and 304, which is beneficial for lower power operation of the power amplifier.

To achieve sufficient load modulation, the number of the non-linear reactance elements 301, 302, 303 and 304 (i.e., the stack) may be selected to provide a range of RF voltage swing on each of the individual non-linear reactance elements of the PTIC 300 stack to take advantage of the non-linear characteristics of each of the individual non-linear reactance elements of the stack. Additionally, in embodiments in which reactance elements 301-304 (or any other reactance elements described herein) are implemented via a tunable barium strontium titanate (BST) dielectric layer of PTIC 300, capacitance ranges (at a fixed bias voltage) of reactance elements 301-304 (and other reactance elements described herein) can be achieved by choosing a particular thickness of the BST layer. Adjustments to the thickness of the BST layer can provide a designer flexibility to make finer adjustments to the capacitance versus voltage profile of the reactance element stack than by changing the number of capacitors in the stack. In yet other embodiments, the capacitance versus voltage profile of a stack can be adjusted by modifying the BST material composition itself, such as by changing the barium to strontium (Ba/Sr) ratio or by adding other dopants to the BST layer. It will be appreciated that varying the number of capacitors in a stack, adjusting a thickness of the BST layer, adjusting the BST material composition, adjusting the deposition and annealing steps, or any combinations thereof, can be controllable parameters that can be used to achieve a desired capacitance versus voltage profile of a capacitor, and thus the capacitance versus voltage profile of a stack.

Depending on the range of RF voltage swing generated by the power amplifier, a number of non-linear reactance elements in the PTIC 300 can range from 1-12 non-linear reactance elements. However, for a voltage range of approximately +/−5 volts, four or fewer non-linear reactance elements in the stack 300 may be utilized. In some embodiments, in which the PTIC 300 includes a stack of four non-linear reactance elements, and the PTIC 300 is incorporated into an amplifier operating at a frequency range from 2 gigahertz (GHz) to 3 GHz, each individual non-linear reactance element may have a capacitance of about 25 picofarads (pF), though in some embodiments, the capacitance may range from about 10 pF to about 35 pF.

Figure 4:
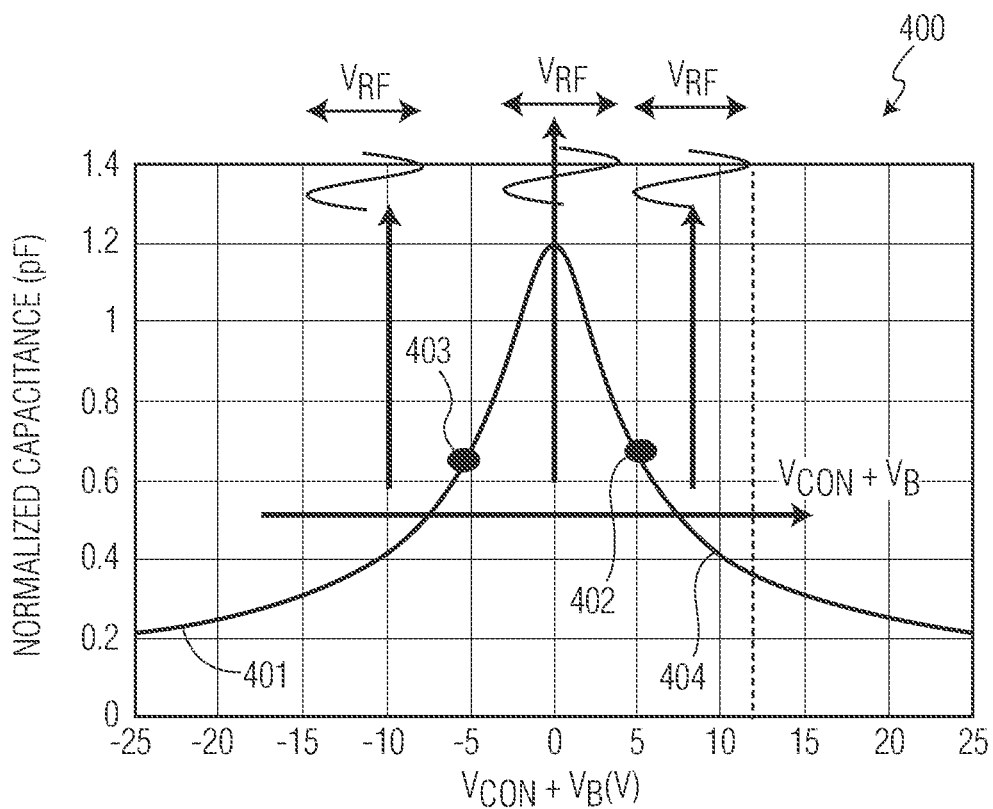
FIG. 4 is a graph illustrating the nonlinear behavior of a plurality of non-linear reactance elements.

An embodiment of the subject disclosure, therefore, may reduce the number of non-linear reactance elements to capitalize on the non-linear effect provided by PTIC 300, thereby providing load modulation, as illustrated in FIGS. 2 and 4. This design feature can be contrary to a design objective where stacks with a large number of non-linear reactance elements are used to divide the RF voltage to small incremental voltage ranges to help eliminate the non-linear effect of the non-linear reactance elements.

PTIC 300 may be packaged in any manner suitable for the desire power amplifier application. For example, in an embodiment, the stack of PTIC 300 may be implemented within an integrated circuit or chip designated by dashed box 350. In that case, components of PTIC 300, such as inductors 308 and 307 may be implemented as components external to the chip 350 in which the stack is fabricated.

FIG. 4 is a graph illustrating the nonlinear behavior of a plurality of non-linear reactance elements (e.g., non-linear reactance elements 301, 302, 303 and 304 of FIG. 3). Graph 400 includes curve 401 depicting the change in capacitance (vertical axis) of reactance elements 301-304 (i.e., of PTIC 300) as a function of an input RF voltage (i.e., the voltage $V_{RF}$ across input terminal 310 and output terminal 311 of PTIC 300 of FIG. 3) and the combination of the bias voltage (e.g., the voltage applied at bias terminal 305) and the external control signal $V_{CON}$ (e.g., the voltage $V_{CON}$ applied a control terminal 309) on the (horizontal axis). The example depicted in FIG. 4 presumes that the DC voltage at both input terminal 310 and output terminal 311 is equal to 0 V.

Depending upon the value of the combination of $V_{CON}$ and $V_B$, the input RF voltage ($V_{RF}$) can modulate the capacitance of PTIC 300 and, specifically, the capacitance of pairs of reactance elements (301/302 and/or 303/304) in a manner that is inversely proportional between elements of the pair of reactance elements.

For example, if the combination of $V_{CON}$ and $V_B$ has a value at reference point 402 illustrated on one side of the curve 401 (or point 403 on the other side of the curve 410), the capacitance of one of the elements in each pair will increase, while the capacitance of the other element of each pair will decrease, thereby resulting in a net change in capacitance of the PTIC 300.

Although the value of $V_B$ will generally be set at a fixed DC bias voltage for many applications, the value of $V_{CON}$ changes over time. For example, in various implementations, the signal $V_{CON}$ is at least partially derived from the envelope or power level of the RF input signal $RF_{IN}$. Consequently, during operation of PTIC 300, the set point (e.g., one of set point 402 or 403) can change over time as the input power level of the amplifier changes. For example, during a lower power operation of an amplifier, the combination of the constant DC bias voltage and the control signal $V_{CON}$, which may have a small magnitude due to the low power operation of the amplifier, may cause PTIC 300 to operate around the set point 402. But, as the amplifier begins operating at a higher power level, the value of $V_{CON}$ will increase, assuming that the $V_{CON}$ signal is at least partially determined by the power level of signals generated by the amplifier. As magnitude of $V_{CON}$ increases, PTIC 300 may begin operating at, for example, set point 404, in which the capacitance values of non-linear reactance elements 301, 302, 303 and 304 is reduced as compared to operation around set point 402.

Consequently, the $V_{CON}$ control signal can be utilized to fine-tune or further control the impedance characteristics of PTIC 300 at different input RF signal power levels, without relying solely on the magnitude of the RF voltage across PTIC 300. This can provide better control over amplifier performance as compared to other configurations in which, for a particular application, the PTIC 300 may be configured to operate at a fixed and non-variable bias voltage set point.

For example, in some implementations, $V_{CON}$ may be determined by the following expression in which $V_{CON}$ is a function of the power level of the RF input signal $RF_{IN}$ in decibel-milliwatts (dBm) ($P_{in}$) and $V_{DD}$ is a fixed voltage value such as the DC operating voltage of the amplifier (e.g., in a GaN-based amplifier operating at 48 VDC, $V_{DD}$ may be set to 48, or equivalently, VBias=48V).

$$V_{CON}(Pin\_dBm) = 10\sqrt{\frac{10^{\frac{Pin}{10}}}{1000}} \quad \text{Equation (1)}$$

Figure 5:
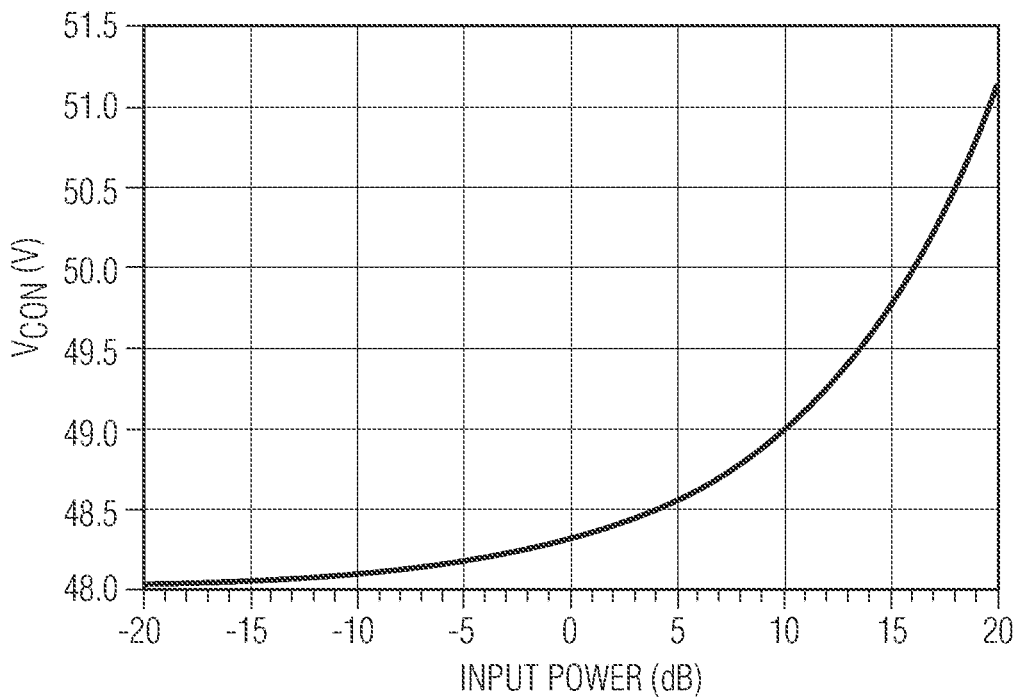
FIG. 5 is a graph depicting the value of VCON as expressed in Equation (1) versus input power.

FIG. 5 is a graph depicting the value of $V_{CON}$ as expressed in Equation (1) versus input power (offset with VBias=48V). As shown, the value of $V_{CON}$ varies non-linearly with input power. Accordingly, when a $V_{CON}$ signal generated in accordance with equation (1) is supplied to the control signal terminal 309 of PTIC 300, as the power level of the input signal received at RF input terminal 310 increases in power, the set point for PTIC 300 will shift towards the right, as illustrated in FIG. 4, reducing the overall capacitance of PTIC 300.

In other embodiments, a multiplier may be applied to equation (1) to determine the value of $V_{CON}$. For example, $V_{CON}$ may be determined by the following expression in which $V_{CON}$ is a function of a multiple (N) of the power level of the RF input signal $RF_{IN}$) in decibel-milliwatts (dBm) (Pin) and $V_{DD}$ is a fixed voltage value such as the DC operating voltage of the amplifier, where N may have a value of 1, 1.5, 2.0, or any other suitable multiplier value, depending upon the application.

$$V_{CON}(Pin\_dBm) = N * 10\sqrt{\frac{10^{\frac{Pin}{10}}}{1000}} \quad \text{Equation (2)}$$

Figure 6:
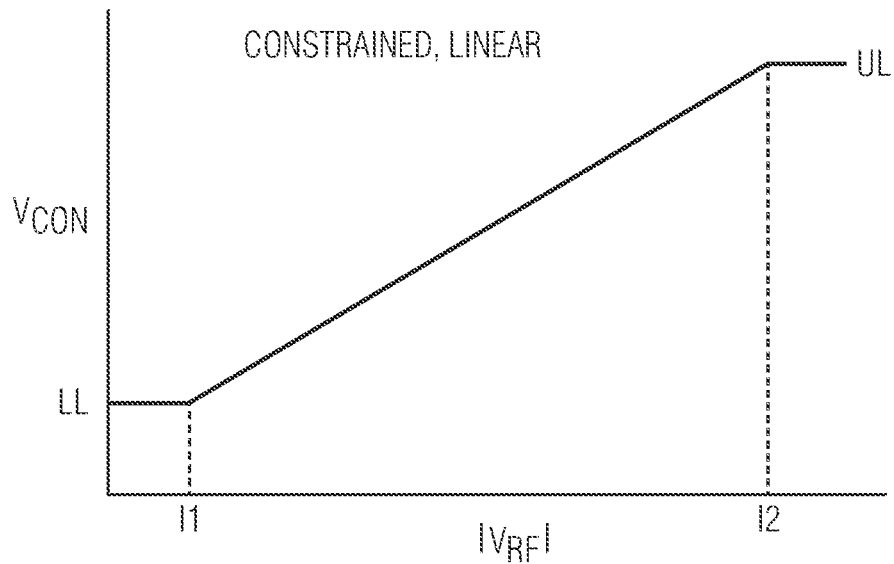
FIG. 6 depicts a linear shaping function, in which the values of VCON are constrained to values below a maximum value and/or above a minimum value for certain values of an envelope function of an RF input signal.

In some further embodiments, a shaping function may be utilized to derive a $V_{CON}$ from the RF input signal $RF_{IN}$ and, specifically, the power level of the input signal. To illustrate, FIG. 6 depicts a linear shaping function, in which the values of $V_{CON}$ are constrained to values below a maximum value and/or above a minimum value for certain values of the envelope function of the RF input signal. In FIG. 6, the horizontal axis represents the magnitude of the envelope of the input signal RF ($|V_{RF}|$), while the vertical axis represents the magnitude of the control signal $V_{CON}$. As illustrated, between $|V_{RF}|$ values I1 and I2, $V_{CON}$ and $|V_{RF}|$ have a linear relationship.

Although the shaping function of FIG. 6 depicts a linear relationship between $V_{CON}$ and $|V_{RF}|$ for $|V_{RF}|$ values between I1 and I2, it should be appreciated that the relationship may be non-linear. For example, the relationship may be governed according to one of equations 1 or 2, above. Alternatively, the shaping function may be any appropriate function that could be exponential, piecewise or contain step function. In accordance with the present disclosure, the shaping function is a function that defines a particular relationship between values of an input RF signal and a corresponding control signal.

Figure 7A:
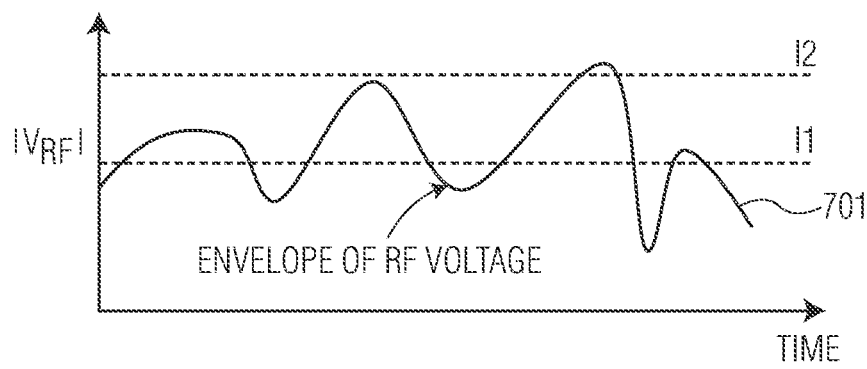
FIGS. 7A-7C depict time-domain waveforms showing the application of the shaping function depicted in FIG. 6 as applied to a sample RF input signal.
Figure 7B:
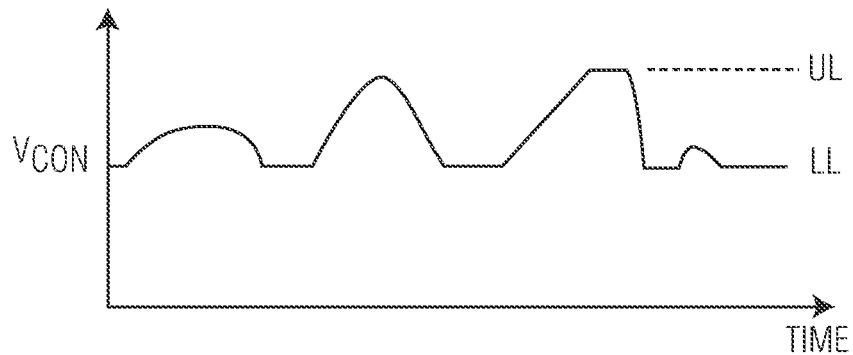
Figure 7C:
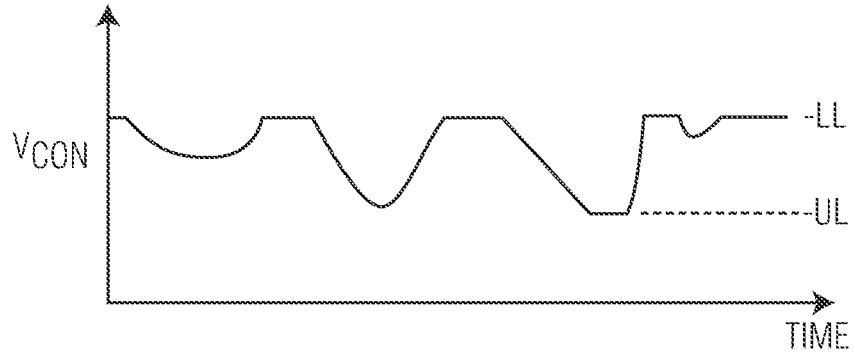

In FIG. 6, the shaping function is bounded so that the value of $V_{CON}$ does not fall below a minimum lower-bounded value (LL), which corresponds to a value of $|V_{RF}|$ equal to I1. The shaping function is also configured so that the value of $V_{CON}$ does not exceed a maximum upper-bounded value (UL), which corresponds to a value of $|V_{RF}|$ equal to I2. In various embodiments, a shaping may apply only a minimum lower-bounded value (LL), only a maximum upper-bounded value (UL), and FIGS. 7A-7C depict time-domain waveforms showing the application of the shaping function depicted in FIG. 6 as applied to a sample RF input signal. In FIG. 7A, the horizontal axis represents time and the vertical axis presents the magnitude of the envelope of the sample input RF signal $|V_{RF}|$. As illustrated, the envelope changes of time as illustrated by curve 701. Magnitudes I1 and I2 of the envelope signal are depicted in the graph.

FIG. 7B depicts a control signal waveform $V_{CON}$ that may be derived from the envelope signal of FIG. 7A. In FIG. 7B, the horizontal axis represents time, and the vertical axis represents the magnitude of the $V_{CON}$ signal. As depicted in FIG. 7B, between the envelope signal magnitudes I1 and I2 of FIG. 7A, the $V_{CON}$ signal varies linearly with the envelope signal in accordance with the shaping function depicted in FIG. 6. Further, in accordance with the shaping function, the values of $V_{CON}$ are constrained to have a lower limit value LL that corresponds to the envelop signal magnitude of I1 and an upper limit value UL that corresponds to the envelop signal magnitude of I2.

In an alternate approach, FIG. 7C depicts a $V_{CON}$ signal that may be derived from the envelope signal of FIG. 7A, where $V_{CON}$ and the envelope signal have an inverse linear relationship. In FIG. 7C, the horizontal axis represents time, and the vertical axis represents the magnitude of the $V_{CON}$ signal. As depicted in FIG. 7C, between the envelope signal magnitudes I1 and I2 of FIG. 7A, the $V_{CON}$ signal varies linearly and inversely with the envelope signal. Further, the values of $V_{CON}$ are constrained to have a lower limit value LL that corresponds to the envelop signal magnitude of I1 and an upper limit value UL that corresponds to the envelop signal magnitude of I2.

In some cases, the control signal shaping may exhibit hysteresis. In that case, a shaping function may be developed that specifies a first relationship between the control signal and the envelope of the RF input signal (e.g., a linear relationship) when the magnitude of the envelope is moving in a first direction (e.g., increasing), while specifying a second relationship between the control signal and the envelope signal (e.g., a non-linear relationship) when the magnitude of the envelope is moving in a second direction (e.g., decreasing).

Figure 8:
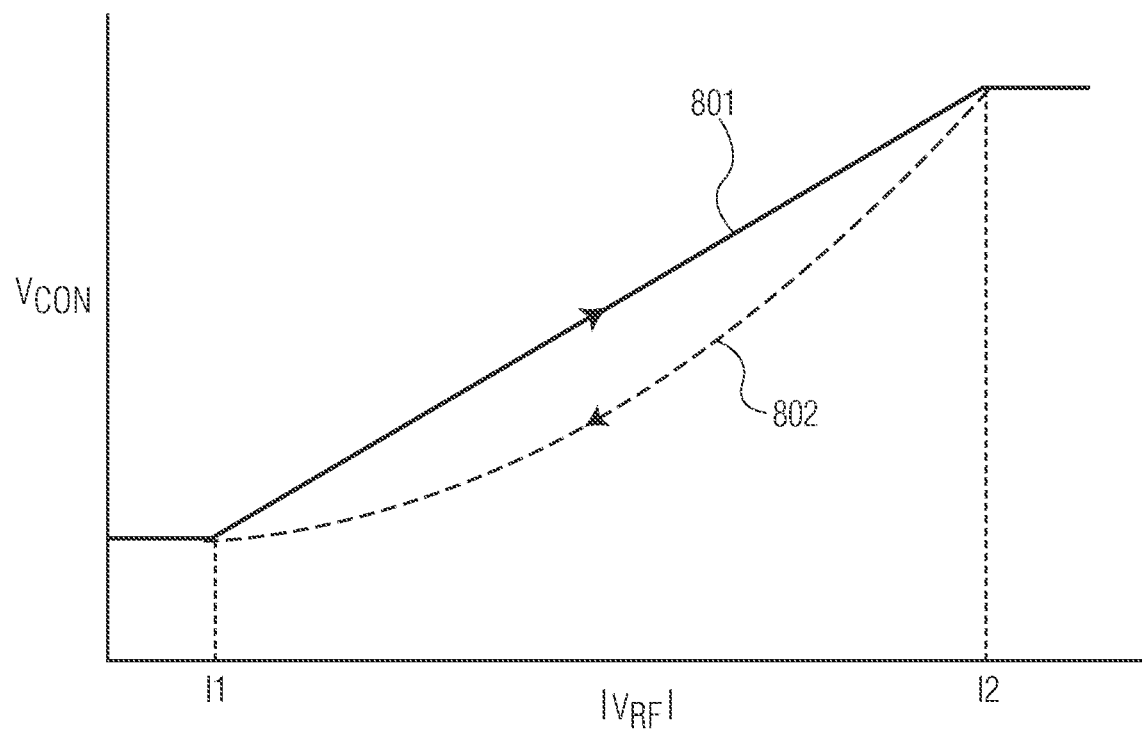
FIG. 8 depicts a shaping function that exhibits hysteresis in which the values of VCON are constrained to values below a maximum value and/or above a minimum value for certain values of an envelope function of an RF input signal.

For example, FIG. 8 depicts a shaping function that exhibits hysteresis in which the values of $V_{CON}$ are also constrained to values below a maximum value and/or above a minimum value for certain values of the envelope function of the RF input signal. In various embodiments, the application of a shaping function that exhibits hysteresis may be useful, for example, in the context of an RF amplifier that exhibits memory effects. An RF amplifier exhibiting memory effects can produce a different output level for the same input level depending on past history of the input signal in time. Hence, it would be beneficial to implement a shaping function configured so that $V_{CON}$ also has a memory or hysteresis behavior whose value is dependent on the input signal and past history (in time) of that signal to offset those memory effects of the RF amplifier. In FIG. 8, the horizontal axis represents the magnitude of the envelope of the input signal RF ($|V_{RF}|$), while the vertical axis represents the magnitude of the $V_{CON}$. As illustrated, for $|V_{RF}|$ values I1 and I2 where $|V_{RF}|$ is increasing, $V_{CON}$ and $|V_{RF}|$ have a first (e.g., linear) relationship (as indicated by segment 801). Conversely, for $|V_{RF}|$ values I1 and I2 where $|V_{RF}|$ is decreasing, $V_{CON}$ and $|V_{RF}|$ have a second (e.g., non-linear) relationship (e.g., quadratic) (as indicated by segment 802).

Although FIG. 3 depicts an example configuration of PTIC 300 in accordance with the present disclosure, it should be understood that PTIC 300 may be implemented in a number of different configurations in accordance with the present disclosure.

Figure 9B:
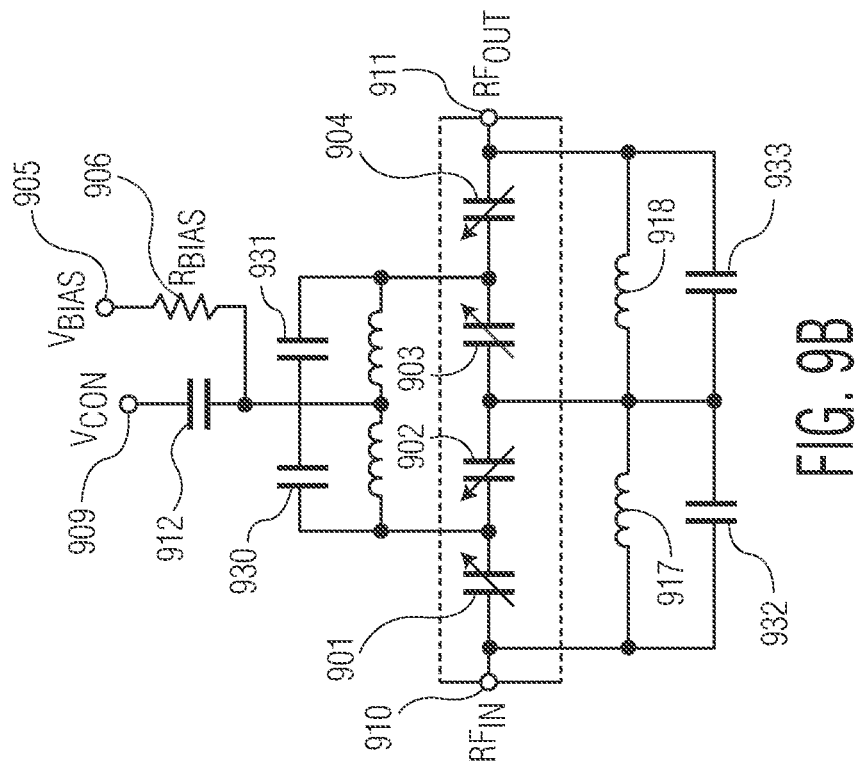
FIGS. 9A-9C depicts various configurations of a PTIC in which the PTIC is configured for use in a series topology and with separate DC bias and control signal inputs.
Figure 9A:
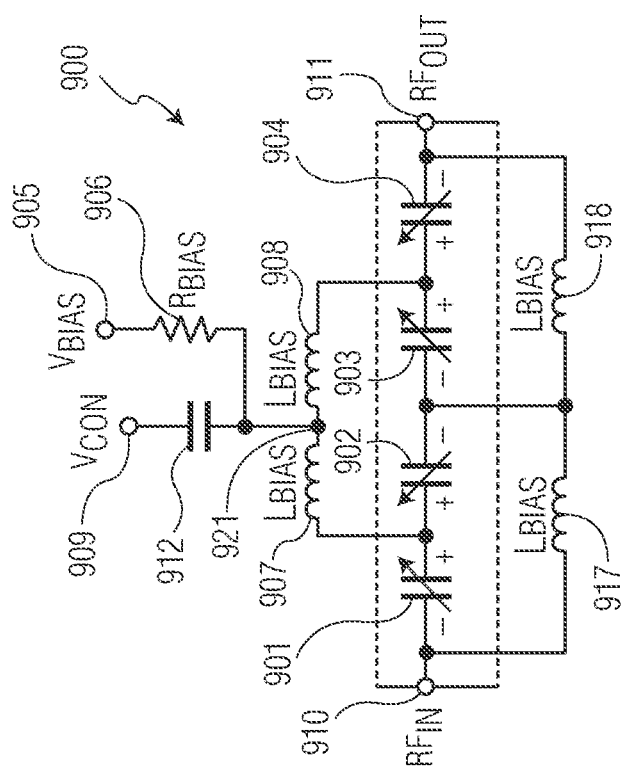
Figure 9C:
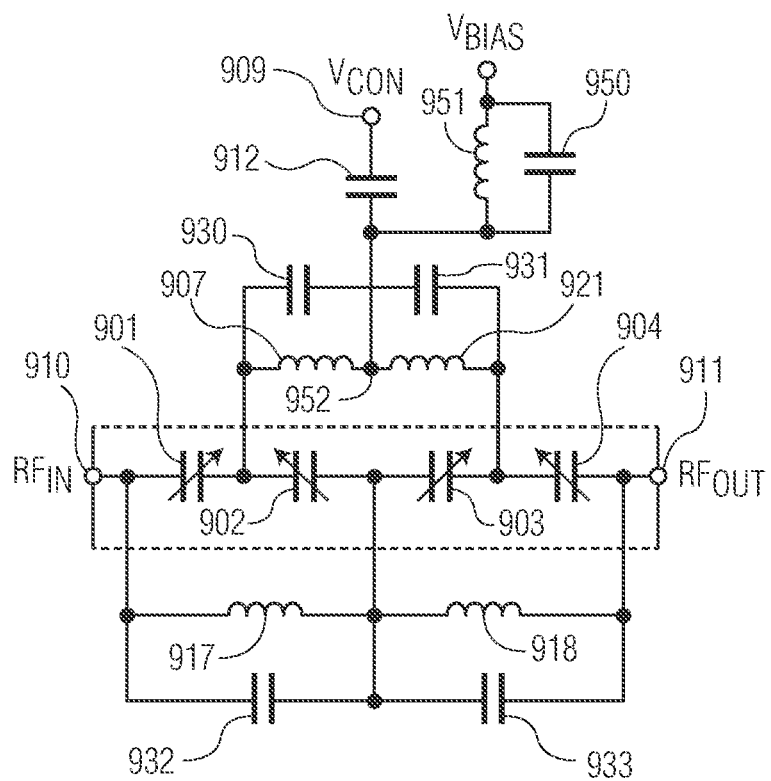

For example, FIGS. 9A-9C depicts various configurations of PTIC 900 in which the PTIC is configured for use in a series topology and with separate DC bias and control signal inputs. As such, PTIC may be utilized is amplifier arrangements in which the input RF signal to PTIC 900 is not DC decoupled.

Specifically, FIG. 9A is a schematic circuit diagram illustrating an embodiment of a PTIC 900 configured to receive as input a DC bias voltage and a time-varying external control signal $V_{CON}$. PTIC 900 includes a plurality of non-linear reactance elements, also referred to as a "stack." Specifically, PTIC 900 includes series-connected non-linear reactance elements 901, 902, 903, 904 that may be configured to modulate the load impedance of a PA as a function of the $V_{CON}$ and $V_{Bias}$ input signals. PTIC 900 includes a DC bias terminal 905 (e.g., DC bias terminal 305, FIG. 3) through which a DC bias voltage ($V_{bias}$) can be applied to the stack of non-linear reactance elements 901, 902, 903, 904 through bias resistor 906 and across inductors 907 and 908. In contrast to the configuration of PTIC 300 in FIG. 3, in PTIC 900, bias resistor 906 is connected to the node 921 between inductors 907 and 908. PTIC 900 includes a control signal terminal 909 (e.g., control signal terminals 309, FIG. 3, 1009, FIGS. 10A, 10B, and 1109, FIGS. 11A-11C). A control signal ($V_{CON}$) applied to control signal terminal 909 is applied to the stack of non-linear reactance element 901, 902, 903, 904 through DC blocking capacitor 912 and across inductors 907 and 908. The polarity of the DC bias voltage $V_{Bias}$ and the $V_{CON}$ signal applied to each non-linear reactance element 901, 902, 903, 904 is illustrated in the circuit diagram with the '+' symbols representing a positive polarity and the '−' signals representing a negative polarity. As an additional input to PTIC 900, an RF voltage ($V_{RF}$) is impressed across the PTIC 900 from RF input terminal 910 (e.g., RF input terminals 310, FIG. 3, 1010, FIGS. 10A, 10B, 1110, FIGS. 11A-11C) to RF output terminal 911 (e.g., RF output terminals 311, FIG. 3, 1011, FIGS. 10A, 10B, 1111, FIGS. 11A-11C). Because the plurality of non-linear reactance elements 901, 902, 903, 904 are arranged in series, they act as a voltage divider, effectively providing a quarter of the RF voltage across each non-linear reactance element.

Inductors 917, 918 are coupled in series between RF input terminal 910 and RF output terminal 911 and the node between inductors 917, 918 is coupled to the node between reactance elements 902 and 903.

When amplifying an RF signal, the load impedance of PTIC 900 changes as a function of power in sync with the RF signal around a set point determined by the values of $V_B$ and $V_{CON}$. A power amplifier output network can therefore be designed utilizing the non-linear reactance attributes of PTIC 900. Depending on the range of RF voltage swing generated by the power amplifier, a number of non-linear reactance elements in the PTIC 900 can range from 1-12 non-linear reactance elements, though different numbers of non-linear reactance elements may be utilized within PTIC 900, depending upon the application.

FIG. 9B depicts an alternate embodiment of PTIC 900 in which a number of additional capacitors are incorporated into the PTIC 900 structure. As shown in FIG. 9B, capacitors 930 and 931 are each coupled in parallel with bias inductors 907 and 908. In this configuration, capacitors 930 and 931 operate in combination with inductors 907 and 908, respectively, to increase the impedance of the conduction paths from the control signal terminal 909 to non-linear reactance elements 901, 902, 903, 904 enabling the use of higher frequency control signals as compared to the PTIC configuration illustrated in FIG. 9A. In a similar manner, capacitors 932 and 933 are each coupled in parallel with bias inductors 917, 918 to reduce the impedance of the conduction path through inductors 917, 918. As such, the incorporation of capacitors 930, 931, 932, 933 into PTIC 900 can increase the reactance of the parallel L/C combinations at RF frequencies so that at RF frequencies the parallel combination of L/C is very high approximating an open circuit. At lower frequencies, e.g., $V_{CON}$, the L/C combinations present a low impedance path from $V_{CON}$ to the internal PTIC nodes.

FIG. 9C depicts a further alternate embodiment of PTIC 900 in which a capacitor is incorporated into the DC bias input network. Specifically, bias resistor 906 is removed from the network as compared to the PTIC 900 of FIG. 9A. To replace bias resistor 906, bias capacitor 950 and inductor 951 are coupled in parallel between DC bias terminal 905 and the node 952 between inductor 907 and 908. In combination, the combination of bias capacitor 950 and inductor 951 creates a high impedance at RF frequencies—frequencies associated with RFin/RFout—that can minimize RF loading effects/losses. Secondly, the combination present a low impedance path at frequencies associated with signal $V_{CON}$ so as to efficiently couple $V_{CON}$ terminal 909 to the internal PTIC 900 nodes.

In other embodiments, a PTIC in accordance with the present disclosure may be configured for use in a shunt topology as compared to the series-connected topology configuration associated with PTIC 900 of FIGS. 9A-9C.

Figure 10A:
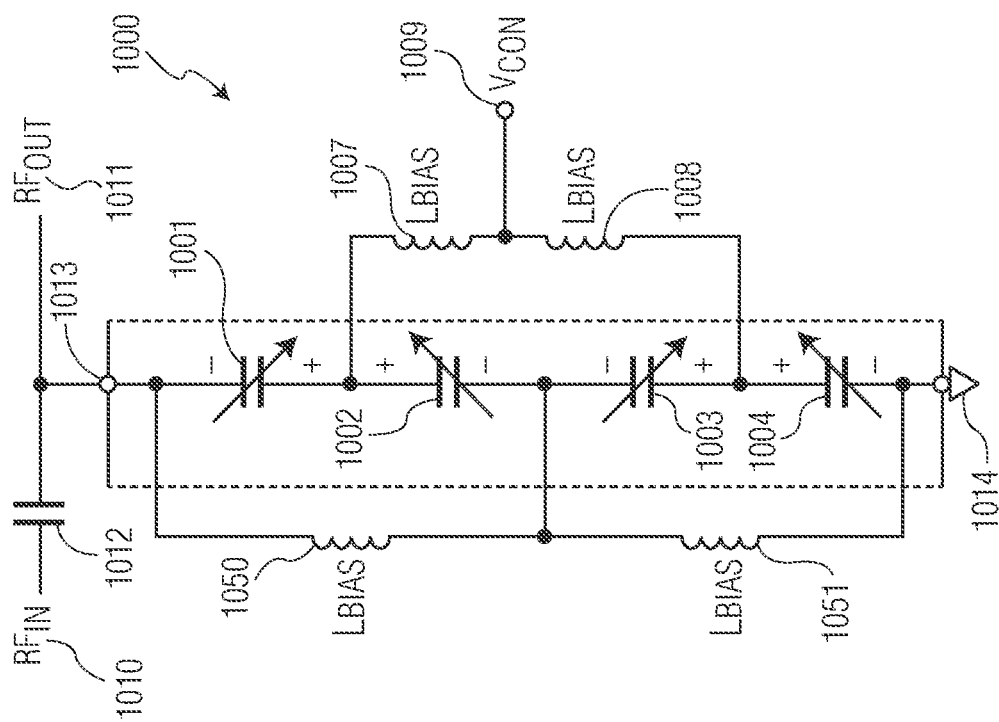
FIGS. 10A-10B depict various configurations of a PTIC in which the PTIC is configured for use in a shunt topology.
Figure 10B:
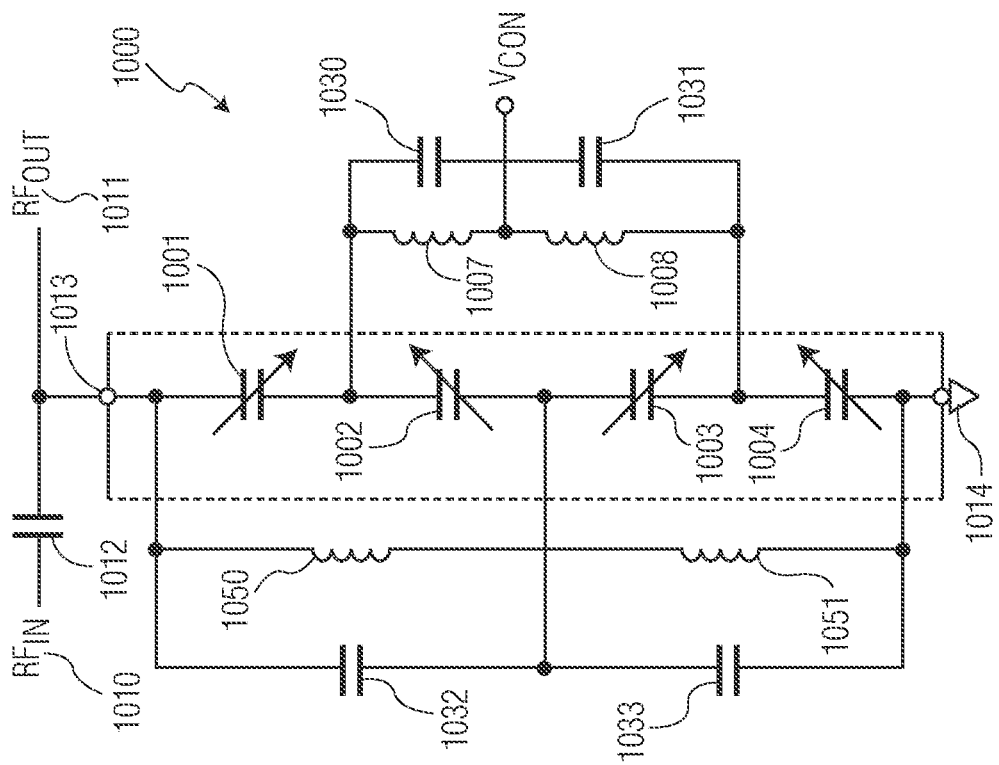

For example, FIGS. 10A-10B depict various configurations of PTIC 1000 in which the PTIC is configured for use in a shunt topology. In this arrangement, the RF signal transmitted through the PTIC's RF input and output terminals is DC-decoupled and, as such, PTIC 1000 is not configured with a separate DC bias input.

FIG. 10A is a schematic circuit diagram illustrating an embodiment of PTIC 1000 configured to receive as input a time-varying external control signal $V_{CON}$. PTIC 1000 includes a plurality of non-linear reactance elements, also referred to as a "stack." Specifically, PTIC 1000 includes series-connected non-linear reactance elements 1001, 1002, 1003, 1004 that may be configured to modulate the load impedance of a PA as a function of the control signal ($V_{CON}$) input signal. The control signal $V_{CON}$ applied to control signal terminal 1009 (e.g., control signal inputs 309, FIG. 3, 909, FIGS. 9A-9C, 1109, FIGS. 11A-11C) is applied to the stack of non-linear reactance element 1001, 1002, 1003, 1004 across inductors 1007 and 1008. The polarity of the $V_{CON}$ signal applied to each non-linear reactance element 1001, 1002, 1003, 1004 is illustrated in the circuit diagram with the '+' symbols representing a positive polarity and the '−' signals representing a negative polarity. As an additional input to PTIC 1000, an RF signal ($V_{RF}$) from RF input terminal 1010 (e.g., RF input terminals 310, FIG. 3, 910, FIGS. 9A-9C, 1110, FIGS. 11A-11C) to RF output terminal 1011 (e.g., RF output terminals 311, FIG. 3, 911, FIGS. 9A-9C, 1111, FIGS. 11A-11C) through blocking capacitor 1012 is impressed across the PTIC 900 from node 1013 to ground reference node 1014. Because the plurality of non-linear reactance elements 1001, 1002, 1003, 1004 are arranged in series, they act as a voltage divider, effectively providing a quarter of the RF voltage across each non-linear reactance element.

Inductors 1050, 1051 are coupled in series between node 1013 and ground terminal 1014 and the node between inductors 1050, 1051 is connected to the node between reactance elements 1002 and 1003.

When amplifying an RF signal, the load impedance of PTIC 1000 changes as a function of power in sync with the RF signal. A PA output network can therefore be designed utilizing the non-linear reactance elements 1001, 1002, 1003, 1004. Depending on the range of RF voltage swing generated by the PA, a number of non-linear reactance elements in the PTIC 1000 can range from 1-12 non-linear reactance elements, though different numbers of non-linear reactance elements may be utilized within PTIC 1000, depending upon the application.

FIG. 10B depicts an alternate embodiment of PTIC 1000 in which a number of additional capacitors are incorporated into the PTIC 1000 structure. As shown in FIG. 10B, capacitors 1030 and 1031 are each coupled in parallel with bias inductors 1007 and 1008. In this configuration, capacitors 1030 and 1031 operate to increase the impedance of the conduction path through inductors 1007, 1008 enabling use of higher frequency control signals as compared to the PTIC configuration depicted in FIG. 10A. In a similar manner, capacitors 1032 and 1033 are each coupled in parallel with bias inductors 1050 and 1052 to reduce the impedance of the conduction path through inductors 1050, 1051.

In still other embodiments, a PTIC in accordance with the present disclosure may be configured for use in a series topology in which the RF signal supplied to the PTIC is DC decoupled.

Figure 11A:
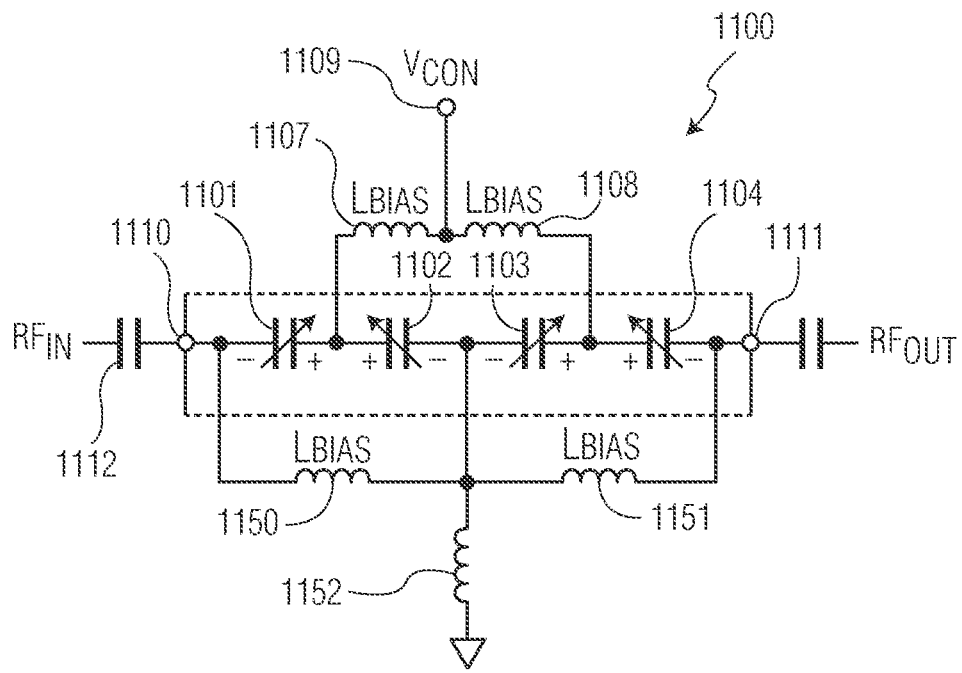
FIGS. 11A-11C depict various configurations of a PTIC in which the PTIC is configured for use in a series-connected topology.
Figure 11B:
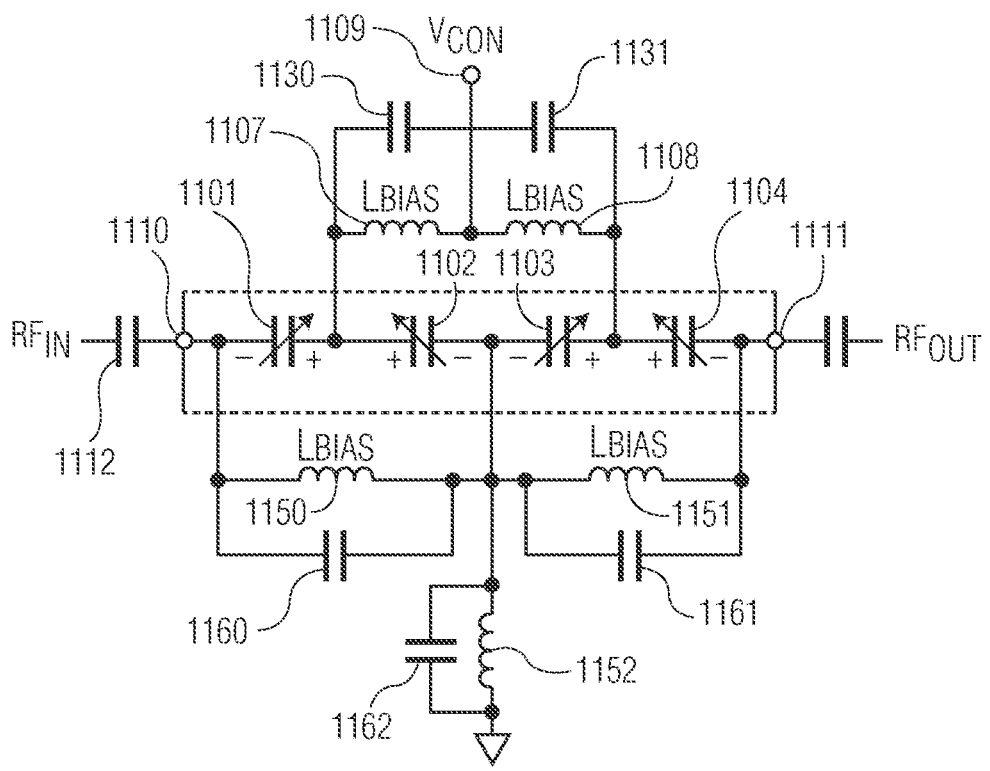
Figure 11C:
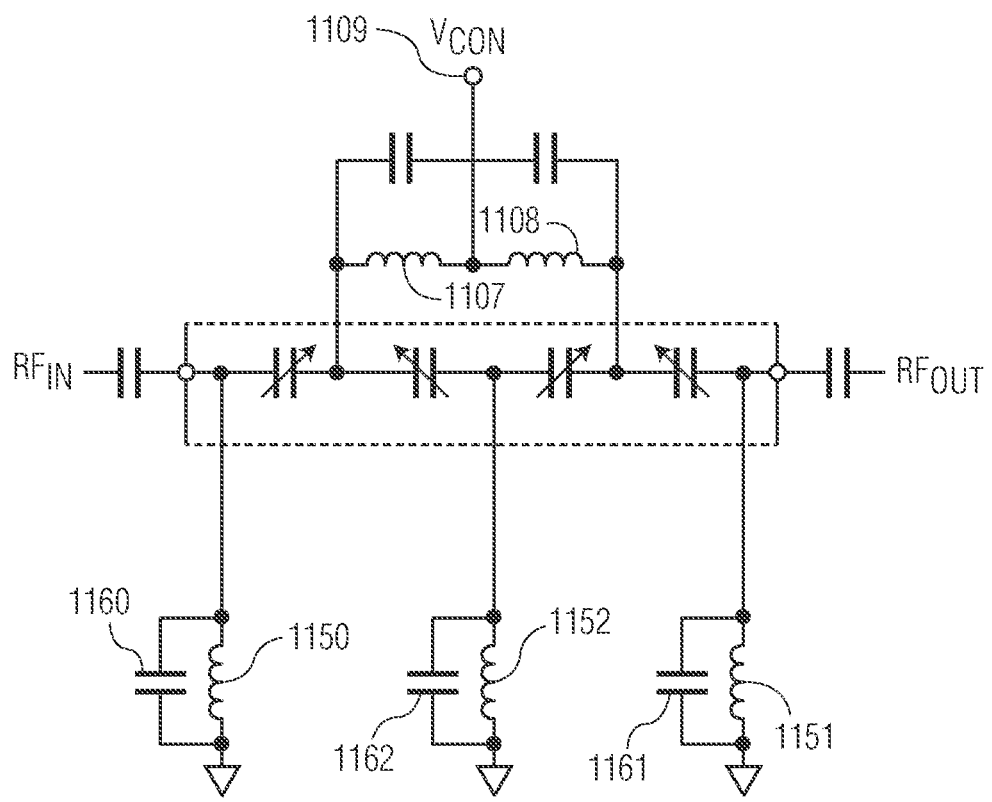

For example, FIGS. 11A-11C depict various configurations of PTIC 1100 in which the PTIC is configured for use in a series-connected topology. In this arrangement, the RF signal transmitted through the PTIC's RF input and output terminals is DC-decoupled and, as such, PTIC 1100 is not configured with a separate DC bias input.

FIG. 11A is a schematic circuit diagram illustrating an embodiment of PTIC 1100 configured to receive as input a time-varying external control signal $V_{CON}$. PTIC 1100 includes a plurality of non-linear reactance elements, also referred to as a "stack." Specifically, PTIC 1100 includes series-connected non-linear reactance elements 1101, 1102, 1103, 1104 that may be configured to modulate the load impedance of a power amplifier as a function of a control signal input ($V_{CON}$). The control signal $V_{CON}$ is applied to control signal terminal 1109 (e.g., control signal terminal 309, FIG. 3, 909, FIGS. 9A-9C, 1009, FIGS. 10A-10B) is applied to the stack of non-linear reactance element 1101, 1102, 1103, 1104 across inductors 1107 and 1108. The polarity of the $V_{CON}$ signal applied to each non-linear reactance element 1101, 1102, 1103, 1104 is illustrated in the circuit diagram with the '+' symbols representing a positive polarity and the '−' signals representing a negative polarity. As an additional input to PTIC 1100, an RF signal received ($V_{RF}$) from RF input terminal 1110 (e.g., RF input terminal 310, FIG. 3, 910, FIGS. 9A-9C, 1010, FIGS. 10A-10B) through blocking capacitor 1112 is impressed across PTIC 1100 to RF output terminal 1111 (e.g., RF output terminals 311, FIG. 3, 911, FIGS. 9A-9C, 1011, FIGS. 10A-10B). Because the plurality of non-linear reactance elements 1101, 1102, 1103, 1104 are arranged in series, they act as a voltage divider, effectively providing a quarter of the RF voltage across each non-linear reactance element.

Inductors 1150, 1151 are coupled in series between RF input terminal 1110 and RF output terminal 1111 and the node between inductors 1050, 1051 is connected to the node between reactance elements 1002 and 1003. Inductor 1152 is connected to the node between inductors 1050, 1051 and a ground terminal.

When amplifying an RF signal, the load impedance of PTIC 1100 changes as a function of power in sync with the RF signal. A PA output network can therefore be designed utilizing the non-linear reactance elements 1101, 1102, 1103, 1104. Depending on the range of RF voltage swing generated by the PA, a number of non-linear reactance elements in the PTIC 1100 can range from 1-12 non-linear reactance elements, though different numbers of non-linear reactance elements may be utilized within PTIC 1100, depending upon the application.

FIG. 11B depicts an alternate embodiment of PTIC 1100 in which a number of additional capacitors are incorporated into the PTIC 1100 structure. As shown in FIG. 11B, capacitors 1130 and 1131 are each coupled in parallel with bias inductors 1107 and 1108. In this configuration, capacitors 1130 and 1131 operate in combination with inductors 1107 and 1108, respectively, to increase the impedance of the conduction paths from the control signal terminal 1109 to non-linear reactance elements 1101, 1102, 1103, 1104 enabling the use of higher frequency control signals as compared to the PTIC configuration illustrated in FIG. 11A. In a similar manner, capacitors 1160, 1161, 1162 are each coupled in parallel with bias inductors 1150, 1151, 1152 to reduce the impedance of the conduction path through inductors 1150, 1151, 1152. As such, the incorporation of capacitors 1130, 1131, 1160, 1161, 1162 into PTIC 1100 can increase the reactance of the parallel L/C combinations at RF frequencies so that at RF frequencies the parallel combination of L/C is very high approximating an open circuit. At lower frequencies, e.g., $V_{CON}$, the L/C combinations present a low impedance path from $V_{CON}$ to the internal PTIC nodes.

FIG. 11C depicts a further alternate embodiment of PTIC 1100 in which inductors 1150, 1151, 1152 and capacitors 1160, 1161, 1162 are arranged in an alternate topology, which may have benefits related to implementation details and physical layout and realization.

Figure 12A:
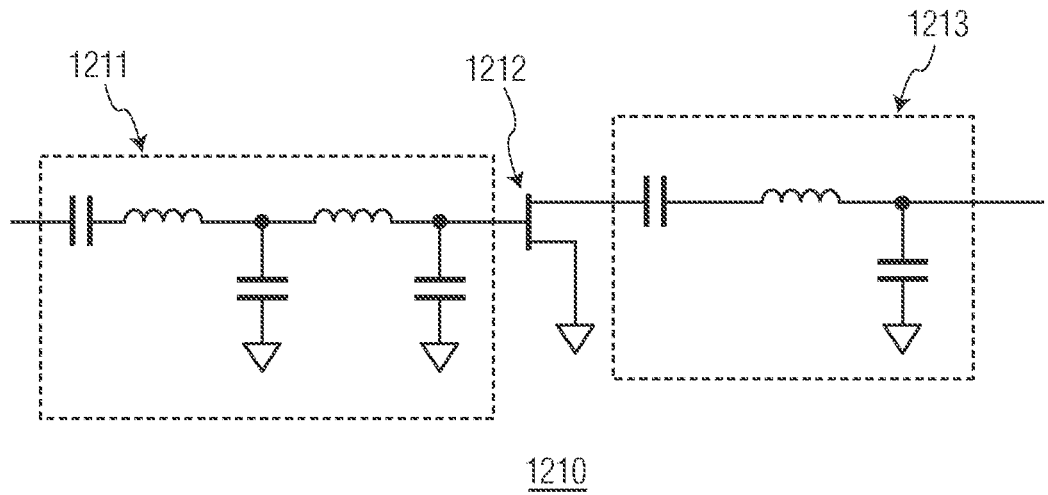
FIG. 12A depicts an amplifier circuit without load modulation elements.
Figure 12B:
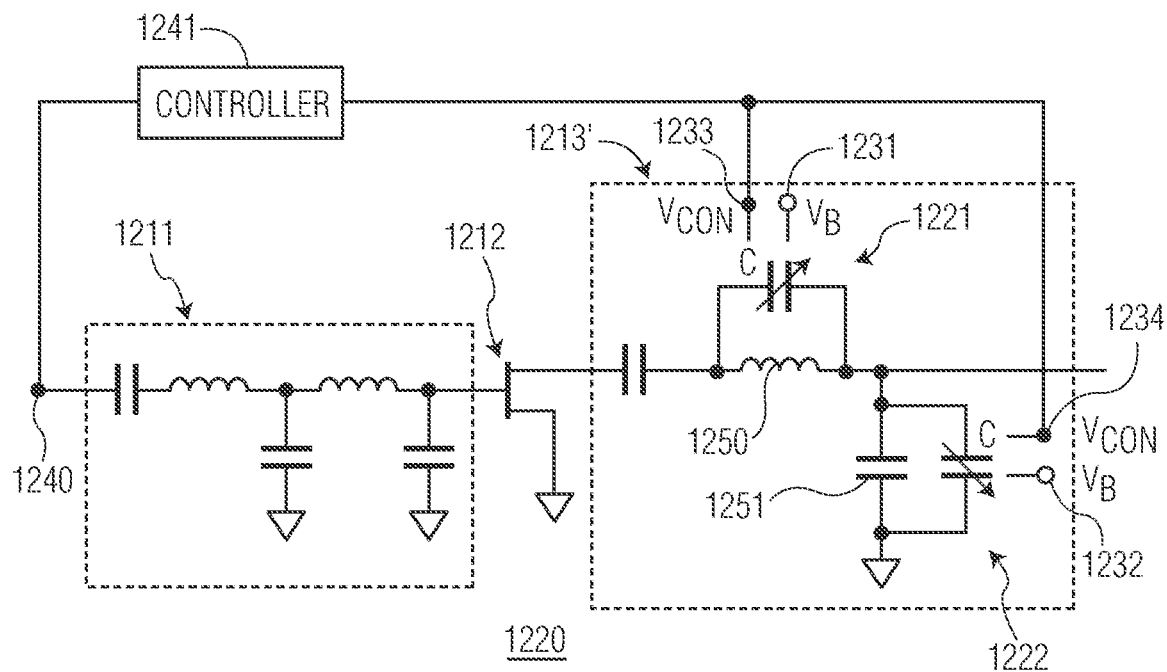
FIG. 12B depicts the amplifier circuit of FIG. 12A modified to be an amplifier circuit that incorporates series and/or shunt non-linear PTIC components.

The various PTIC device (e.g., PTICs 300, FIG. 3, 900, FIGS. 9A-9C, 1000, FIGS. 10A-10B, and 1000, FIGS. 11A-11C) configurations presented exhibit variable impedance enabling their use in impedance matching networks of RF amplifiers to provide enhance load modulation control or modulation. For example, FIG. 12A depicts amplifier circuit 1210 without load modulation elements and FIG. 12B depicts the amplifier circuit of FIG. 12A modified to be an amplifier circuit 1220 that incorporates series and/or shunt non-linear PTIC components 1221, 1222 (e.g., each corresponding to the series and/or shunt PTIC configurations of PTIC 300, FIG. 3, 900, FIGS. 9A-9C, 1000, FIGS. 10A-10B, and 1000, FIGS. 11A-11C, or variations thereof). The parallel and/or shunt PTIC components 1221, 1222 can improve the power efficiency of the amplifier circuit 1220 utilizing the load modulation feature provided by the PTIC components 1221, 1222. As shown in FIG. 12A, the amplifier circuit 1210 comprises an input network 1211 (e.g., an input impedance transformation circuit) coupled to a gate or control terminal of a transistor 1212, and an output network 1213 (e.g., an output impedance transformation network) coupled to a drain or output terminal of the transistor 1212. Amplifier circuit 1220 of FIG. 12B also comprises an input network 1211 coupled to the gate or control terminal of transistor 1212, and a modified output network 1213' coupled to the drain or output terminal of transistor 1212. The modified output network 1213' differs from output network 1213 in that it further comprises a first non-linear reactance component, PTIC 1221, that is arranged in parallel with a series inductor 1250 in the output network 1213', and a second non-linear reactance component, PTIC 1222 that is arranged in parallel with a shunt capacitor 1251 in the output network 1213'.

Both PTICs 1221 and 1222 include bias voltage $V_B$ terminals 1231, 1232 (e.g., vias terminals 305, FIG. 3, 905, FIGS. 9A-9C) for receiving a fixed bias voltage $V_B$ to be applied to PTICS 1221, 1222 to at least partially establish their respective operating points. In various implementations, the fixed bias $V_B$ can be a ground voltage or another preferable operating point in the PTIC's capacitance to voltage profile.

Both PTICs 1221 and 1222 also include control signal terminals 1233, 1234 (e.g., control signal terminals 309, FIG. 3, 909, FIGS. 9A-9C, 1009, FIGS. 10A-10B, and 1109, FIGS. 11A-11C) for receiving external control signals in accordance with the present disclosure. As described herein, the control signals are time-varying signals enabling fine-tuned control over the impedance presented by PTICs 1221 and 1222. In various embodiments, the control signals are derived from or partially determined by the RF signal (or an envelope thereof) being supplied to amplifier 1220 through RF input terminal 1240.

In various embodiments, controller 1241 (e.g., a digital controller, analog control circuit, or combinations thereof) is incorporated into amplifier 1220 to generate control signals that are supplied to the control signal terminals 1233 and 1234 of each PTIC 1221, 1222. Controller 1241 may include a signal processor, application specific integrated circuit (ASIC), analog circuitry, a general-purpose processor, and combinations thereof that is configured to analyze input RF signals and apply shaping functions to those RF signals to generate one or more output signals that can, ultimately, be supplied as a control signal input to PTICs 1221, 1222. For example, in amplifier 1220, controller 1241 is electrically connected to RF input terminal 1240 of amplifier 1220. Controller 1241 receives the RF signal as an input and, in various embodiments, is configured to generate an envelope signals based upon the input RF signal. Controller 1241 can then apply a shaping function (e.g., one or more of the shaping functions described herein and illustrated in at least FIGS. 5, 6, 7A-7C, and 8 or any shaping function equations such as equation (1) and equation (2) presented herein) to generate an output control signal. That control signal can then be communicated to the control signal terminals 1233 and 1234 of PTICs 1221 and 1222.

It should be further appreciated that the placement of PTICs 1221, 1222 illustrated in FIG. 12B is non-limiting. For example, PTICs 1221, 1222 can be placed in series (or parallel) with other components of the output network, the input network, or in another matching network (not illustrated). For instance, a similar arrangement of PTICs 1221, 1222 can be used with (e.g., placed in parallel with) the inductor and capacitor of the input networks 611 that are connected to the gate terminal of the transistor 612. In still other embodiments, PTICs 1221, 1222 may be placed in series with inductors and/or capacitors of the input and output networks 611, 613'. Accordingly, instances of PTICs 1221, 1222 can be used for input load modulation and/or output load modulation when such components are utilized in parallel (or in series) with inductors and/or capacitors of the input network 611 and/or the modified output network 613'.

Figure 13:
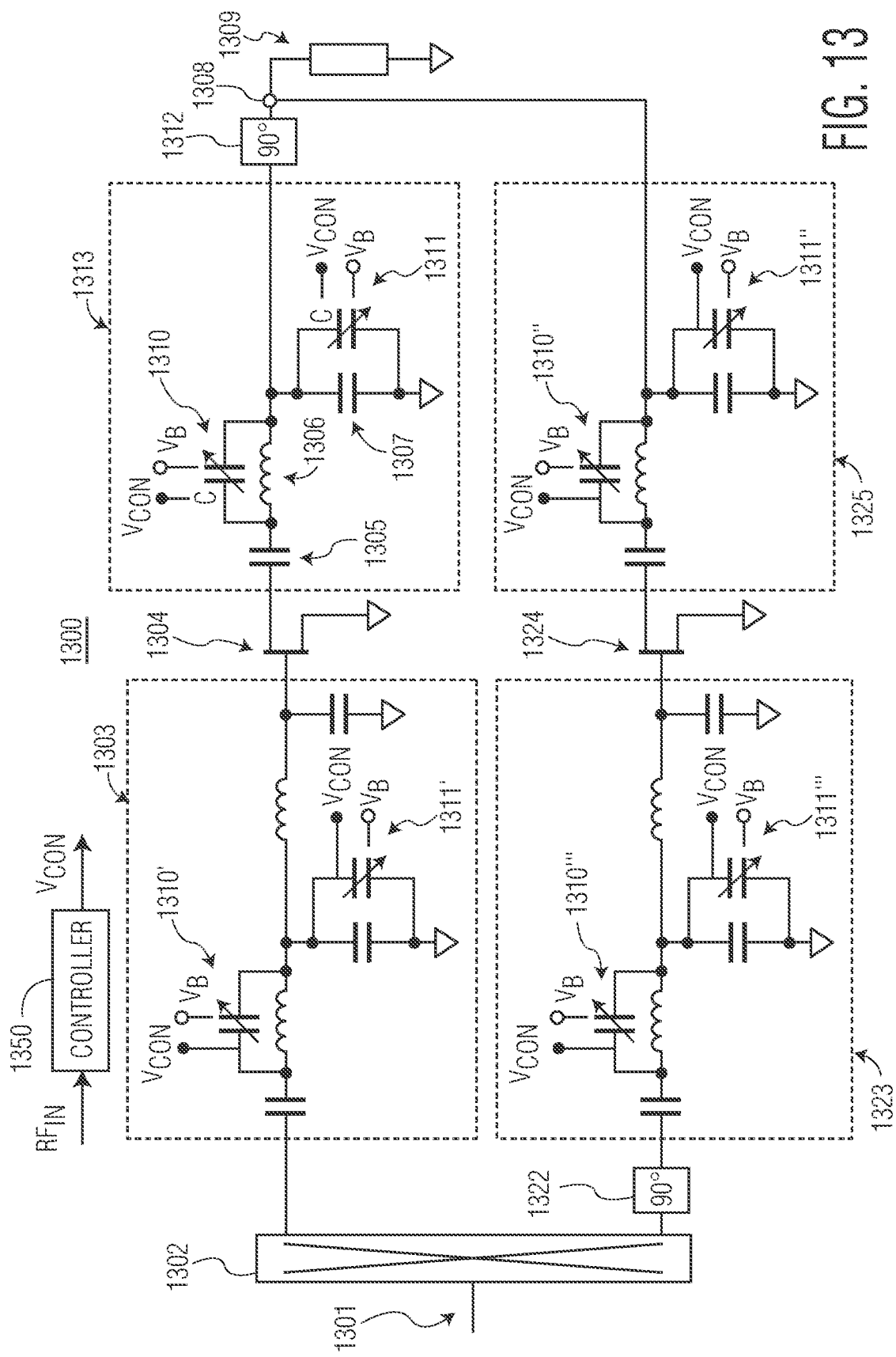
FIG. 13 is a schematic circuit diagram illustrating a Doherty amplifier implementation that incorporates the PTICs of the present disclosure into the amplifier's input and output networks to provide load modulation for the amplifier.

FIG. 13 is a schematic circuit diagram illustrating a Doherty amplifier implementation that incorporates the PTICs (e.g., PTICs 300, FIG. 3, 900, FIGS. 9A-9C, 1000, FIGS. 10A-10B, and 1000, FIGS. 11A-11C) of the present disclosure into the amplifier's input and output networks to provide load modulation for the amplifier. Doherty amplifier 1300 is configured as a "two-way" Doherty power amplifier, which includes a carrier amplifier 1304 and a peaking amplifier 1324. Although not shown, the carrier amplifier 1304 and the peaking amplifier 1324 can each include combinations of an input matching network and pre-amplifier configured in series that is connected to an inter-stage matching network of the carrier amplifier 1304 and the peaking amplifier 1324, respectively. Reference below to a gate terminal of the carrier amplifier 1304 and the peaking amplifier 1324, respectively, can be considered illustrative when such components are integrated into the carrier amplifier 1304 and the peaking amplifier 1324. The carrier amplifier 1304 provides amplification along a carrier amplification path, and the peaking amplifier 1324 provides amplification along a peaking amplification path. Doherty amplifier 1300 includes signal splitter 1302 coupled to an input terminal 1301, and a carrier amplifier path having an input network 1303 coupled to an output of the signal splitter 1302 and a gate terminal of carrier amplifier 1304, and an output network 1313 coupled to a drain terminal of the carrier amplifier 1304 and through an impedance transformer 1312 to a combining node 1308. Doherty amplifier 1300 further comprises a peaking amplifier path having an input network 1323 coupled to a phase-shifter 1322 at an output of the signal splitter 1302 and a gate terminal of the peaking amplifier 1324, and an output network 1325 coupled to a drain terminal of the peaking amplifier 1324 and the combining node 1308.

Signal splitter 1302 is configured to divide the power of an input RF signal ($RF_{IN}$) received at input terminal 1301 into carrier and peaking portions of the input signal. During operation in a full-power mode when both the carrier and peaking amplifier are supplying current to a load 1309, signal splitter 1302 divides the input signal power between the amplification paths. In an embodiment, the signal splitter 1302 may divide the power equally. It is important that phase coherency between the carrier and peaking amplification paths is maintained across a frequency band of interest to ensure that the amplified carrier and peaking signals arrive in phase at the combining node 1308, and thus to ensure proper Doherty amplifier operation.

In the embodiment illustrated in FIG. 13, the output network 1313 of the carrier amplifier 1304 comprises a capacitor-inductor-capacitor (CLC) network comprising a series capacitor 1305, a series inductor 1306 and a shunt capacitor 1307. The output network 1313 further includes a PTIC 1310 (e.g., (e.g., PTICs 300, FIG. 3, 900, FIGS. 9A-9C, and 1000, FIGS. 11A-11C) that is parallel to series inductor 1306 and a shunt PTIC 1311 (e.g., PTIC 1010, FIGS. 10A and 10B) that is parallel to shunt capacitor 1307. PTICs 1310, 1311 can be configured to utilize a fixed bias voltage (e.g., 0 volts) or another bias voltage depending upon the Doherty amplifier 100. For example, if carrier amplifier 1304 and peaking amplifier 1324 are implemented as 48 V GaN transistors, the bias voltage may be set to 48 V. PTICs 1310, 1311 include bias voltage terminals ($V_B$) configured to receive a bias voltage to establish their respective operating points. In various implementations, the fixed bias voltage $V_B$ can be a ground voltage or another operating point in the PTIC's capacitance to voltage profile.

Both PTICs 1310, 1311 also include control signal terminals $V_{CON}$ for receiving external control signals in accordance with the present disclosure. As described herein, the control signals can be time-varying signals enabling fine-tuned control over the impedance presented by PTICs 1310, 1311. In various embodiments, the control signals are derived from or partially determined by the RF signal being supplied to Doherty amplifier 1300 through RF input terminal 1301. For example, Doherty amplifier 1300 includes controller 1350. Controller 1350 is configured to receive the RF signal received at terminal 1301 (i.e., $RF_{IN}$) as an input. Controller 1350 then, in various embodiments, is configured to generate an envelope signal based upon the input RF signal. Controller 1350 can then apply a shaping function (e.g., one or more of the shaping functions described herein and illustrated in at least FIGS. 5, 6, 7A-7C, and 8) to generate an output control signal. That control signal can then be communicated to the control signal terminals PTICs 1310 and 1311.

PTICs 1310, 1311 added to the output network 1313 of the carrier amplifier path can provide load modulation to the carrier amplifier 1304 as described herein.

Doherty amplifier 1300 also comprises a peaking amplifier path that includes a phase shifter 1322 coupled to the signal splitter 1302. In a non-inverted Doherty configuration, input phase delay for the peaking amplifier is achieved by phase shifter 1322 coupled between signal splitter 1302 and peaking amplifier input network 1323. According to an embodiment, phase shifter 1322 applies about 90 degrees of phase delay to the peaking input signal before the signal is provided to the peaking amplifier 1324. In certain embodiments, phase shifter 1322 may include a quarter wave transmission line, a lumped-element delay circuit, or another suitable type of delay element of about 90 degrees.

The output network 1313 of the carrier amplifier and the output network 1325 of the peaking amplifier are coupled to the combining node 1308 through an impedance transformer 1312. The impedance transformer 1312 compensates for the 90-degree phase delay difference between the carrier and peaking amplification paths introduced by phase shifter 1322. Load 1309 may be coupled to the combining node 1308 to receive an amplified RF signal from Doherty amplifier 1300.

Doherty amplifier 1300 can have alternate embodiments such as multiple amplifier peaking paths and/or an "inverted" load network configuration. In an inverted load configuration, a Doherty amplifier is configured so that an input signal supplied to the carrier amplifier is delayed by about 90 degrees with respect to the input signal(s) supplied to the peaking amplifier(s). To compensate for the phase difference between the carrier and peaking paths, an output phase delay of 90 degrees can be applied to the output signal(s) of the peaking amplifier(s) before reaching the combining node 1308.

The carrier amplifier 1304 and the peaking amplifier 1324 can be configured to include a single power transistor or multiple cascaded power transistors for amplifying an RF signal supplied by the signal splitter 1302 via input network 1303. As used herein, the term "transistor" means a field effect transistor (FET) or another type of suitable transistor. For example, a "FET" may be a metal-oxide-semiconductor FET (MOSFET), a laterally diffused MOSFET (LDMOS FET), an enhancement-mode or depletion-mode high electron mobility transistor (HEMT), or another type of FET. According to various embodiments, each of the power transistors in the carrier and peaking amplifier may be implemented, for example, using a silicon-based FET (e.g., an LDMOS FET), a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET).

Although the carrier and peaking amplifiers 1304, 1324 may be of equal size (e.g., in a symmetric Doherty configuration with a 1:1 carrier-to-peaking size ratio), the carrier and peaking amplifier transistors 1304, 1324 may have unequal sizes, as well (e.g., in various asymmetric Doherty configurations). In an asymmetric two-way Doherty amplifier configuration, the peaking amplifier 1324 typically is larger than the carrier amplifier 1304 by some multiplier. For example, the peaking amplifier 1324 may be twice the size of the carrier amplifier 1304 so that the peaking amplifier 1324 has twice the current carrying capability of the carrier amplifier 1304. Asymmetric carrier-to-peaking amplifier size ratios other than a 1:2 ratio may be implemented, as well. In such embodiments, the signal splitter 1302 may divide the power unequally, and may match the asymmetric size ratio, particularly when the Doherty amplifier 1300 has an asymmetric configuration other than a 1:1 carrier-to-peaking size ratio.

In an embodiment, the carrier amplifier 1304 and the peaking amplifier 1324 may include a single-stage amplifier. In yet other embodiments, the carrier amplifier 1304 and peaking amplifier 1324 may each have more than the two, cascade-coupled amplification stages. Input and inter-stage impedance matching networks may be implemented, respectively, at the input networks 1303, 1323 of each driver amplifier and between each driver amplifier and each final-stage amplifier (not shown). These components (as previously noted) may also be embedded in each of the carrier amplifier 1304 and the peaking amplifier 1324. In each case, the matching networks may incrementally increase the circuit impedance toward the load impedance. In addition to providing signal amplification of an input signal at the input terminal 1301, each splitter branch of the signal splitter 1302 may also provide a 50 ohm (or other) input impedance suitable for the input networks 1303, 1323 and output impedance matching characteristics that may eliminate in whole or in part a need for output matching networks of the carrier amplifier and the peaking amplifier, respectively.

Doherty amplifier 1300 may be "integrated," as that term is used herein, because at least the carrier amplifier 1304, the peaking amplifier 1324, and the combining node 1308 are integrally and monolithically formed in one single IC die, which may be referred to herein as an "integrated Doherty amplifier die." In an alternate embodiment, the combining node 1308 may be implemented separately from the IC die that includes the carrier amplifier and the peaking amplifier. According to an embodiment, all or portions of the input and inter-stage impedance matching networks also may be integrally and monolithically formed in the same IC die.

During operation of Doherty PA 1300, carrier amplifier 1304 can be biased to operate in class A, class B, or class AB modes, and peaking amplifier 1324 typically can be biased to operate in class C mode. In some configurations, peaking amplifier 1324 can alternatively be biased to operate in other modes. In an embodiment, the amplifier of each splitter 1302 branch may also be biased to operate according to the same mode or a suitable mode of operation in conjunction with the modes utilized by the carrier amplifier 1304 and the peaking amplifier 1324, respectively. When the power of the input signal exceeds a threshold level of the peaking amplifier transistor 1324, Doherty amplifier 1300 operates in a high-power mode in which the carrier amplifier 1304 and the peaking amplifier 1324 both supply current to the load 1309. At this point, the peaking amplifier 1324 provides active load modulation at combining node 1308, allowing the current of the carrier amplifier 1304 to continue to increase linearly without any appreciable increase in carrier amplifier 1304 output voltage, thus maintaining linear operation of the carrier amplifier 1304 in class AB mode.

At low power levels, where the power of the input signal at input terminal 1301 is lower than the turn-on voltage level of peaking amplifier 1324, Doherty amplifier 1300 operates in a low-power (or back-off) mode in which the carrier amplifier 1304 is the only amplifier supplying current to the load 1309.

Due to the placement of PTICs 1310, 1311 in the output network 1313, the carrier amplifier 1304 can be presented with a controlled (and, in many embodiments, higher) effective load impedance due to the non-linear effect of PTICs 1310, 1311 when supplied with appropriate control signals, which extends the range of load modulation to further increase the efficiency of the carrier amplifier 1304 when the peaking amplifier 1324 is turned off. In an embodiment, PTICs 1310' and 1311' may be placed in the input network 1303 of the carrier amplifier path. In another embodiment, PTICs 1310" and 1311" may be placed in the output network 1325 of the peaking amplifier path. In yet another embodiment, PTICs 1310''' and 1311''' may be placed in the input network 1323 of the peaking amplifier path.

Figure 14:
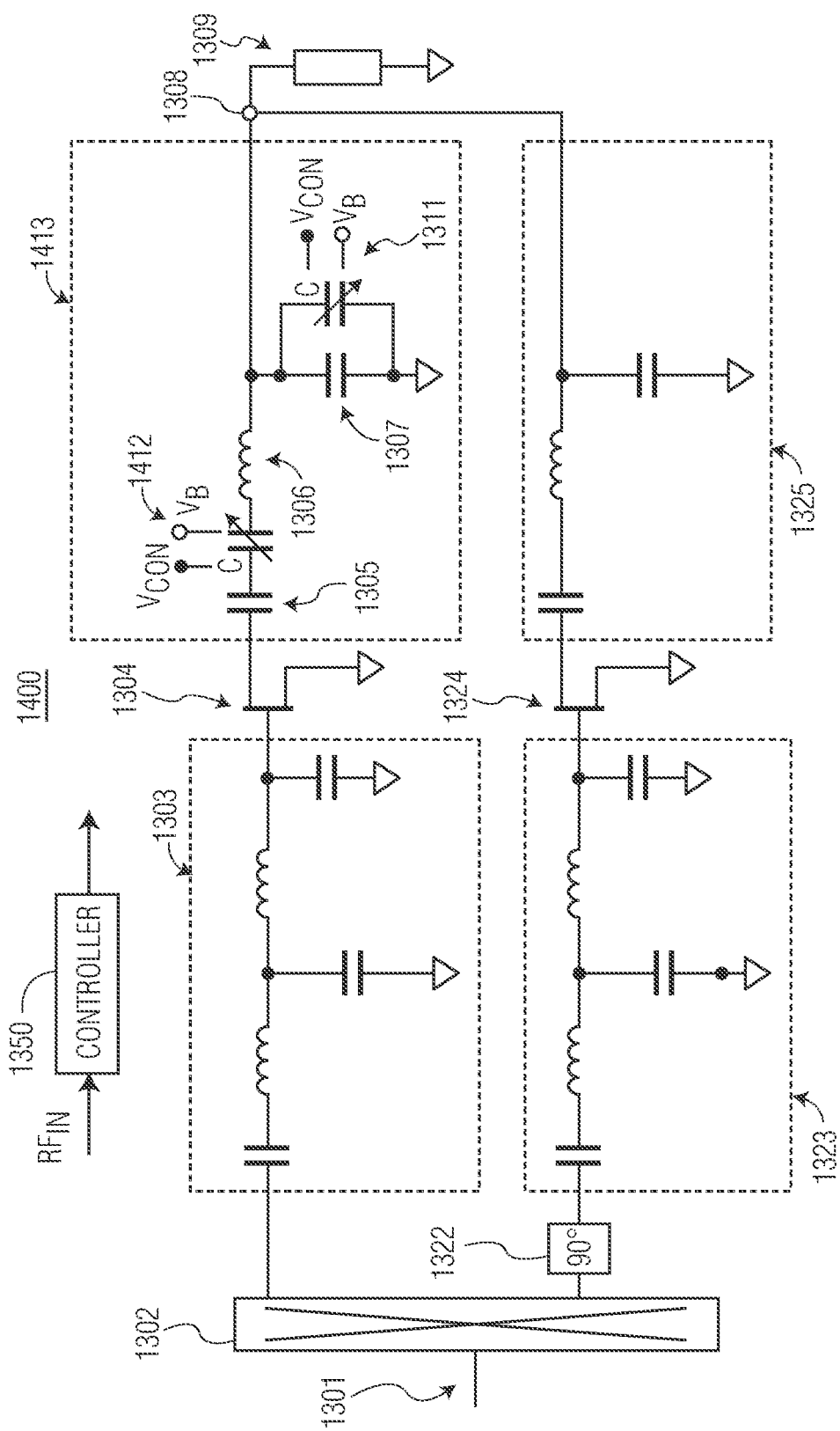
FIG. 14 is a schematic circuit diagram illustrating an embodiment of a series/shunt configuration implemented in a modified output network of the carrier amplifier of the Doherty amplifier of FIG. 13.

FIG. 14 is a schematic circuit diagram illustrating an embodiment of a series/shunt configuration implemented in a modified output network 1413 of carrier amplifier 1304 of the Doherty amplifier 1300 of FIG. 13. In the embodiment of amplifier 1400 illustrated in FIG. 14, the modified output network 1413 comprises the same capacitor-inductor-capacitor (CLC) network of FIG. 13 with, however, a PTIC 1412 placed in series with the series capacitor 1305, which is in contrast to the parallel PTIC 1310 illustrated in FIG. 13. Similar to the description provided for FIG. 13, the non-linear reactance components 1311 and 1412 of the modified output network 1413 include bias voltage terminals configured to receive a bias voltage to establish their respective operating points. In various implementations, the fixed bias $V_B$ can be a ground voltage or another preferable operating point in the PTIC's capacitance to voltage profile.

Both PTICs 1311, 1412 also include control signal terminals $V_{CON}$ for receiving external control signals in accordance with the present disclosure. As described herein, the control signals are time-varying signals enabling fine-tuned control over the impedance presented by PTICs 1311, 1412. In various embodiments, the control signals are derived from or partially determined by the RF signal being supplied to Doherty amplifier 1400 through RF input terminal 1301.

PTICs 1311, 1412 added to the output network 1413 of the carrier amplifier path can provide load modulation to the carrier amplifier 1304 as described herein.

It will be appreciated that other or similar configurations of PTICs can be applied to the input networks 1303, 1323, and output network 1325 of the peaking amplifier 1324.

Figure 15:
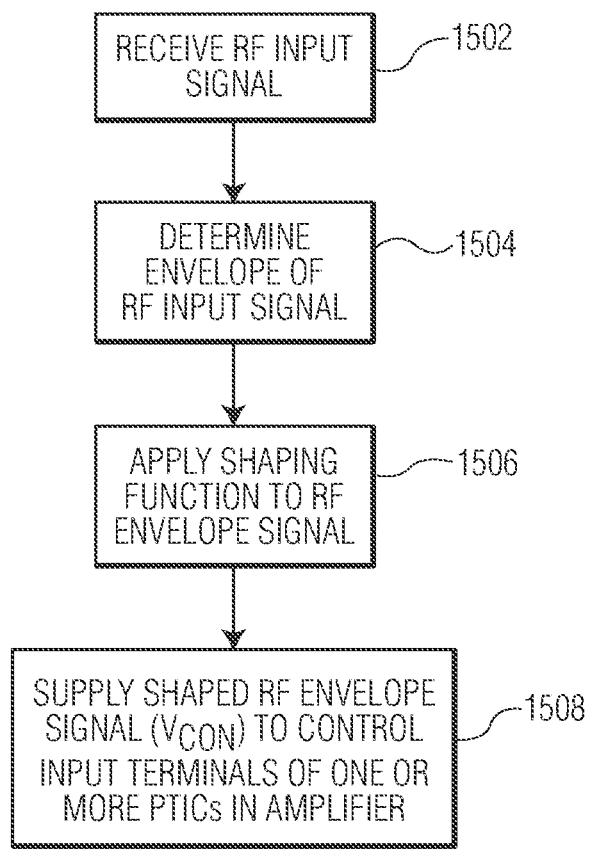
FIG. 15 is a method depicting a flowchart that may be implemented by a controller of a Doherty amplifier system.

FIG. 15 is a flow chart depicting an example method that may be implemented by a controller (e.g., controller 1241, 1350, of FIGS. 12B, 13, and 14) in accordance with the present disclosure. In step 1502 the controller receives as an input an RF signal (e.g., received via an RF input terminal) and instep 1504 the controller determines an envelope of that input RF signal. With the envelope signal determined, in step 1506 the controller applies an appropriate shaping function (e.g., one or more of the shaping functions of FIGS. 6, &A-7C, and 8 and described herein). To generate a shaped envelope function. In step 1508, the controller supplies the shaped envelope function to the control terminals (e.g., one or more of $V_{CON}$ terminals 309, 909, 1009, 1109, 1233, 1234, FIGS. 3, 9A-9C, 10A-10B, 11A-11C, and 12) of one or more of the PTICs or equivalent components of the amplifier device.

An embodiment of a device includes an amplifier having an input terminal and an output terminal. The input terminal is configured to receive a radio frequency (RF) input signal. The device includes an output network coupled to the output terminal of the power amplifier and a first passively tunable integrated circuit (PTIC) coupled to the output network. The first PTIC includes a direct-current (DC) bias voltage input terminal configured to receive a fixed bias voltage, a control signal input terminal configured to receive a time-varying control signal, wherein the fixed bias voltage in combination with the time-varying control signal sets an operating reference point of the first PTIC, and an input terminal electrically connected to the output terminal of the amplifier, wherein a change in an output voltage signal generated by the power amplifier causes the first PTIC to modify a first effective impedance of a load presented to the power amplifier via the output network.

An embodiment of a device includes an amplifier having an input terminal and an output terminal, an output network coupled to the output terminal of the power amplifier, and a non-linear reactance component coupled to the output network. The non-linear reactance component includes a control signal input terminal configured to receive a time-varying control signal, wherein the fixed bias voltage in combination with the time-varying control signal sets an operating reference point of the first PTIC, and an input terminal electrically connected to the output terminal of the amplifier, wherein a change in an output voltage signal generated by the power amplifier causes the first PTIC to modify a first effective impedance of a load presented to the power amplifier via the output network.

An embodiment of a Doherty amplifier includes a carrier amplifier coupled to a first output network, wherein the first output network includes a non-linear reactance component configured to utilize a fixed bias voltage and a time-varying control signal to determine an operating reference point of the non-linear reactance component. The Doherty amplifier includes a peaking amplifier coupled to a second output network. The first output network is coupled to the second output network resulting in a combined network configurable for coupling to a load, wherein a change in an output voltage signal generated by the carrier amplifier causes the non-linear reactance component to change an effective impedance of the load presented to the carrier amplifier via the combined network.

The preceding detailed description is merely illustrative in nature and is not intended to limit the embodiments of the subject matter or the application and uses of such embodiments. For example, although the above description discusses the use of a GaN final stage IC die in various embodiments, other types of III-V transistors (e.g., GaAs transistors, InP transistors, and so on) may be used as a final stage IC die, in other embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device, comprising:
an amplifier having an amplifier input terminal and an amplifier output terminal, wherein the amplifier input terminal is configured to receive a radio frequency (RF) input signal;
an output network coupled to the amplifier output terminal of the power amplifier; and
a first passively tunable integrated circuit (PTIC) coupled between the amplifier and the output network, the first PTIC including:
a PTIC input terminal electrically coupled to the amplifier output terminal,
a PTIC output terminal electrically coupled to the output network,
a direct-current (DC) bias voltage input terminal configured to receive a fixed bias voltage,
a control signal input terminal configured to receive a time-varying control signal, wherein the fixed bias voltage in combination with the time-varying control signal sets an operating reference point of the first PTIC, and
a plurality of variable capacitors coupled in series between the PTIC input terminal and the PTIC output terminal, and electrically coupled to the DC bias voltage input terminal and the control signal input terminal, and
wherein a change in an output voltage signal generated by the power amplifier causes the first PTIC to modify a first effective impedance of a load presented to the power amplifier via the output network.

2. The device of claim 1, further comprising a controller, the controller including:
an input terminal electrically connected to the amplifier input terminal; and
an output terminal electrically connected to the control signal input terminal of the first PTIC, wherein the controller is configured to:
receive, at the input terminal of the controller, the RF input signal,
generate, based on the RF input signal, the time-varying control signal, and
transmit the time-varying control signal to the control signal input terminal of the first PTIC.

3. A device, comprising:
an amplifier having an input terminal and an output terminal, wherein the input terminal is configured to receive a radio frequency (RF) input signal;
an output network coupled to the output terminal of the power amplifier; and
a first passively tunable integrated circuit (PTIC) coupled to the output network, the first PTIC including:
a direct-current (DC) bias voltage input terminal configured to receive a fixed bias voltage,
a control signal input terminal configured to receive a time-varying control signal, wherein the fixed bias voltage in combination with the time-varying control signal sets an operating reference point of the first PTIC, and
an input terminal electrically connected to the output terminal of the amplifier, wherein a change in an output voltage signal generated by the power amplifier causes the first PTIC to modify a first effective impedance of a load presented to the power amplifier via the output network; and
a controller, the controller including:
an input terminal electrically connected to the input terminal of the amplifier; and
an output terminal electrically connected to the control signal input terminal of the first PTIC, wherein the controller is configured to:
receive, at the input terminal of the controller, the RF input signal,
generate, based on the RF input signal, the time varying control signal according to the expression V_CON=N √((10^(Pin/10))/1000), where VCON is the time varying control signal, N is a real number, and Pin is a power level of the RF input signal, and
transmit the time-varying control signal to the control signal input terminal of the first PTIC.

4. The device of claim 2, wherein the controller is configured to determine an envelope of the RF input signal and apply a shaping function to the envelope of the RF input signal to generate the time-varying control signal.

5. The device of claim 4, wherein the shaping function defines a minimum voltage value and a maximum voltage value of the time-varying control signal.

6. The device of claim 4, wherein the shaping function exhibits hysteresis so that a value of the time-varying control signal is at least partially determined by whether the envelope of the RF input signal is increasing or decreasing.

7. The device of claim 1, wherein a number of the plurality of variable capacitors is selected to produce a non-linear impedance profile that operates within a range of an output voltage signal generated by the power amplifier and the operating reference point of the first PTIC.

8. The device of claim 7, wherein each variable capacitor of the plurality of variable capacitors includes a tunable barium strontium titanate dielectric layer.

9. The amplifier system of claim 7, wherein the plurality of variable capacitors comprises four or fewer variable capacitors.

10. The device of claim 1, wherein the amplifier input terminal is electrically connected to an input network and the input network includes a second PTIC to modulate a second effective impedance of the input network presented at the amplifier input terminal.

11. A Doherty amplifier, comprising:
a carrier amplifier coupled to a first output network, wherein the first output network includes a non-linear reactance component configured to utilize a fixed bias voltage and a time-varying control signal to determine an operating reference point of the non-linear reactance component; and
a peaking amplifier coupled to a second output network, wherein the first output network is coupled to the second output network resulting in a combined network configurable for coupling to a load, wherein a change in an output voltage signal generated by the carrier amplifier causes the non-linear reactance component to change an effective impedance of the load presented to the carrier amplifier via the combined network, and
wherein the non-linear reactance component includes:
an input terminal electrically coupled to an output of the carrier amplifier,
an output terminal electrically coupled to the second output network, and
a plurality of variable capacitors coupled in series between the input terminal and the output terminal.

12. The Doherty amplifier of claim 11, wherein the non-linear reactance component further includes a direct-current (DC) bias voltage input terminal configured to receive the fixed bias voltage, and a control signal input terminal configured to receive the time-varying control signal, and wherein the plurality of variable capacitors is electrically coupled to the DC bias voltage input terminal and to the control signal input terminal.

13. The Doherty amplifier of claim 11, further comprising a controller, wherein the controller is configured to:
generate, based on a radio frequency (RF) input signal to the Doherty amplifier, the time-varying control signal; and
transmit the time-varying control signal to a control signal input terminal of the non-linear reactance component.

14. A Doherty amplifier, comprising:
a carrier amplifier coupled to a first output network, wherein the first output network includes a non-linear reactance component configured to utilize a fixed bias voltage and a time-varying control signal to determine an operating reference point of the non-linear reactance component;
a peaking amplifier coupled to a second output network, wherein the first output network is coupled to the second output network resulting in a combined network configurable for coupling to a load, wherein a change in an output voltage signal generated by the carrier amplifier causes the non-linear reactance component to change an effective impedance of the load presented to the carrier amplifier via the combined network; and
a controller, wherein the controller is configured to:
generate, based on a radio frequency (RF) input signal to the Doherty amplifier, the time varying control signal according to the expression $V\_CON = N \sqrt{((10^{(Pin/10)})/1000)}$, where VCON is the time varying control signal, N is a real number, and Pin is a power level of the RF input signal; and
transmit the time-varying control signal to a control signal input terminal of the non-linear reactance component.

15. The Doherty amplifier of claim 13, wherein the controller is configured to determine an envelope of the RF input signal and apply a shaping function to the envelope of the RF input signal to generate the time-varying control signal.

16. The Doherty amplifier of claim 15, wherein the shaping function exhibits hysteresis so that a value of the time-varying control signal is at least partially determined by whether the envelope of the RF input signal is increasing or decreasing.

17. The Doherty amplifier of claim 11, wherein a number of the plurality of variable capacitors is selected to produce a non-linear impedance profile that operates within a range of the output voltage signal generated by the carrier amplifier and the operating reference point of the non-linear reactance component.

18. The device of claim 1, wherein:
the plurality of variable capacitors of the first PTIC includes a first capacitor, a second capacitor, a third capacitor, and a fourth capacitor;
a first terminal of the first capacitor is coupled to the PTIC input terminal;
a second terminal of the first capacitor is coupled to a first node;
a first terminal of the second capacitor is coupled to the first node;
a second terminal of the second capacitor is coupled to a second node;
a first terminal of the third capacitor is coupled to the second node;
a second terminal of the third capacitor is coupled to a third node;
a first terminal of the fourth capacitor is coupled to the third node; and
a second terminal of the fourth capacitor is coupled to the PTIC output terminal.

19. The device of claim 18, further comprising:
a first inductor, a second inductor, a third inductor, and a fourth inductor coupled between the direct-current bias voltage input terminal, and wherein
the DC bias voltage input terminal is coupled to the third node,
the first and second inductors are coupled in series between the DC bias voltage input terminal and the first node,
the third inductor is coupled between the first node and the second node, and
the fourth inductor is coupled between the second node and the third node.

20. The device of claim 19, wherein:
the control signal input terminal is coupled to an intermediate node between the first and second inductors.

* * * * *